United States Patent
Joo et al.

(10) Patent No.: US 9,189,384 B2
(45) Date of Patent: Nov. 17, 2015

(54) MEMORY SYSTEM AND MEMORY MANAGING METHOD THEREOF

(75) Inventors: Sang-Hyun Joo, Hwaseong-Si (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 529 days.

(21) Appl. No.: 13/553,845

(22) Filed: Jul. 20, 2012

(65) Prior Publication Data
US 2013/0117500 A1    May 9, 2013

(30) Foreign Application Priority Data
Nov. 4, 2011    (KR) .................. 10-2011-0114280

(51) Int. Cl.
| | | |
|---|---|---|
| *G06F 12/02* | (2006.01) | |
| *G11C 11/56* | (2006.01) | |
| *G11C 13/00* | (2006.01) | |
| *G11C 16/34* | (2006.01) | |

(52) U.S. Cl.
CPC ............ *G06F 12/0246* (2013.01); *G11C 11/56* (2013.01); *G11C 11/5607* (2013.01); *G11C 11/5621* (2013.01); *G11C 11/5628* (2013.01); *G11C 11/5635* (2013.01); *G11C 11/5678* (2013.01); *G11C 11/5685* (2013.01); *G11C 13/0002* (2013.01); *G11C 13/0004* (2013.01); *G11C 13/0007* (2013.01); *G11C 13/0035* (2013.01); *G11C 13/0069* (2013.01); *G11C 13/0097* (2013.01); *G11C 16/349* (2013.01); *G11C 2211/5641* (2013.01); *G11C 2211/5644* (2013.01)

(58) Field of Classification Search
CPC .................. G06F 12/0246; G06F 2212/7205; G11C 16/3495
See application file for complete search history.

(56) References Cited

U.S. PATENT DOCUMENTS

| | | | |
|---|---|---|---|
| 7,221,587 B2 | 5/2007 | Yamashita et al. | |
| 7,535,761 B2 | 5/2009 | Park et al. | |
| 7,548,457 B2 | 6/2009 | Kang et al. | |
| 7,804,718 B2 | 9/2010 | Kim | |
| 2009/0182936 A1* | 7/2009 | Lee .............................. | 711/103 |
| 2010/0042775 A1 | 2/2010 | Yeh | |
| 2010/0226183 A1 | 9/2010 | Kim | |

(Continued)

FOREIGN PATENT DOCUMENTS

| | | |
|---|---|---|
| KR | 100763353 B1 | 9/2007 |
| KR | 100822804 B1 | 4/2008 |

(Continued)

*Primary Examiner* — Christian P Chace
*Assistant Examiner* — Eric Loonan
(74) *Attorney, Agent, or Firm* — Volentine & Whitt, PLLC

(57) ABSTRACT

A memory managing method is provided for a memory system, including a nonvolatile memory device and a memory controller controlling the nonvolatile memory device. The memory managing method includes determining whether a program-erase number of a memory block in the nonvolatile memory device reaches a first reference value; managing a life of the memory block according to a first memory managing method when the program-erase number of the memory block is determined to be less than the first reference value; and managing the life of the memory block according to a second memory managing method different from the first memory managing method when the program-erase number of the memory block is determined to be greater than the first reference value.

3 Claims, 20 Drawing Sheets

(56) References Cited

U.S. PATENT DOCUMENTS

2010/0228907 A1* 9/2010 Shen .............................. 711/103
2010/0241788 A1* 9/2010 Yeh ............................... 711/103

FOREIGN PATENT DOCUMENTS

KR     1020100015423 A    2/2010
WO     WO 2005/109441 A1   11/2005

* cited by examiner if C_PEC > R1_PEC

▨ : Fade-Out WL

MEMORY SYSTEM AND MEMORY MANAGING METHOD THEREOF

CROSS-REFERENCE TO RELATED APPLICATIONS

A claim of priority under 35 U.S.C. §119 is made to Korean Patent Application No. 10-2011-0114280 filed Nov. 4, 2011, in the Korean Intellectual Property Office, the entire contents of which are hereby incorporated by reference.

BACKGROUND

Embodiments of the inventive concept described herein relate to a memory system including a nonvolatile memory device.

There is increasing demand for electrically erasable and programmable semiconductor memory devices without refresh of data stored therein. The trend is toward increasing storage capacity and integration of memory devices. An example of a nonvolatile memory device providing a large storage capacity and high level of integration without refresh of stored data is a NAND flash memory device. Since flash memory devices retain data even when power is off, they are widely used in electronic devices which commonly experience sudden interruptions in power (e.g., portable terminals, portable computers, etc.).

Data-retention characteristics and the number of program/erase cycles are closely associated with reliability and life span of nonvolatile memory devices having floating gate structures. Stored charge (electrons) may leak from a floating gate as a result of various types of failure, causing a threshold voltage to decrease. On the other hand, a floating gate slowly obtains electrons with a control gate maintained with a specific voltage. This means that a threshold voltage increases. Iteration of program/erase cycles forces an oxide film of a cell transistor to be stressed, causing failures, such as tunnel oxide breakdown of a cell transistor. In flash memory devices, program/erase endurance is mainly affected since charge is trapped within a tunnel oxide film during program and erase operations. Charge trap affects a threshold voltage window of the memory device or program/erase times of subsequent cycles.

SUMMARY

One aspect of the inventive concept is directed to a memory managing method for a memory system, including a nonvolatile memory device and a memory controller controlling the nonvolatile memory device. The memory managing method includes determining whether a program-erase number of a memory block in the nonvolatile memory device reaches a first reference value; managing a life of the memory block according to a first memory managing method when the program-erase number of the memory block is determined to be less than the first reference value; and managing the life of the memory block according to a second memory managing method different from the first memory managing method when the program-erase number of the memory block is determined to be greater than the first reference value.

Another aspect of the inventive concept is directed to a memory system including a storage medium and a memory controller. The storage medium includes multiple nonvolatile memory devices and is configured to store data. The memory controller includes a buffer memory and is configured to control the nonvolatile memory devices. The memory controller manages a life of each of the nonvolatile memory devices using one of a first memory managing method and a second memory managing method, based on whether a program-erase number of each memory block of each nonvolatile memory device reaches a reference value. When the life of each nonvolatile memory device is managed according to the second memory managing method, addresses transferred to the nonvolatile memory device during a write operation where data are sequentially stored in at least two memory blocks of the nonvolatile memory device are partially discontinuous.

Another aspect of the inventive concept is directed to a memory system including a nonvolatile memory device including a memory block having multiple word lines and a memory controller configured to manage a life of the memory block of the nonvolatile memory device based on a program-erase number of the memory block. When the program-erase number of the memory block is less than a reference value, the memory controller manages the life of the memory block by block unit, and when the program-erase number of the memory block is greater than the reference value, the memory controller manages the life of the memory block by word line unit.

BRIEF DESCRIPTION OF THE FIGURES

Exemplary embodiments will be more clearly understood from the following detailed description taken in conjunction with the accompanying drawings, wherein like reference numerals refer to like parts unless otherwise specified, in which.

DETAILED DESCRIPTION

Figure 1:
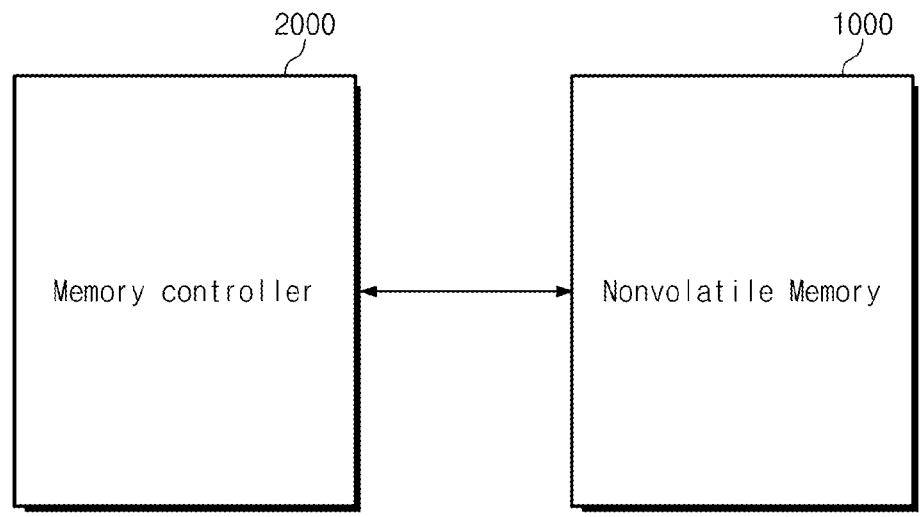
FIG. 1 is a block diagram schematically illustrating a memory system, according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. In the drawings, the size and relative sizes of layers and regions may be exaggerated for clarity. Unless otherwise noted, like reference numerals denote like elements throughout the attached drawings and written description, and thus descriptions will not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system, according to an embodiment of the inventive concept.

Referring to FIG. 1, the memory system according to an embodiment of the inventive concept includes a nonvolatile memory device 1000 and a memory controller 2000. The nonvolatile memory device 1000 is used as a storage medium for storing data. The storage medium may be formed of one or more memory chips. The nonvolatile memory device 1000 communicates with the memory controller 2000 via one or more channels. The nonvolatile memory device 1000 may include a NAND flash memory device, for example. The controller 2000 is configured to control the nonvolatile memory device 1000 according to external requests, e.g., from an external device, such as a host, or internal request, e.g., background operations, such as merge, garbage collection, etc.

It is understood that in various embodiments, the nonvolatile memory device 1000 is not limited to a NAND flash memory device. For example, nonvolatile memory device 1000 may be a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like, without departing from the scope of the present teachings. Further, the nonvolatile memory device 1000 may be implemented to have a three-dimensional array structure. A nonvolatile memory device with the three-dimensional array structure may be referred to as a vertical NAND flash memory device. The inventive concept also may be applied to a Charge Trap Flash (CTF) memory device including a charge storage layer formed of an insulation film, as well as a flash memory device including a charge storage layer formed of a conductive floating gate.

Unlike volatile memory devices, such as dynamic random access memory (DRAM) and static random access memory (SRAM), the nonvolatile memory device 1000 does not support data overwriting. For this reason, the nonvolatile memory device 1000 performs an erase operation to update the same storage region (e.g., a memory block) with data. That is, the nonvolatile memory device 1000 performs program and erase operations, referred to as a program-erase cycle. The nonvolatile memory device 1000 is able to perform a certain number of program-erase cycles, referred to as the program-erase number, which determines, in part, the life span or life of the nonvolatile memory device (or, memory blocks within the nonvolatile memory device 1000). The life of the nonvolatile memory device 1000 may be guaranteed on the basis of the program-erase number. Conventionally, the program-erase number may be decided by a test operation performed during the manufacturing process.

When the actual or measured program-erase number of a particular memory block reaches the guaranteed program-erase number, the memory controller 2000 classifies that memory block as an unusable block. Since the endurance of the nonvolatile memory device 1000 is guaranteed by memory block, the endurance of a memory block may be determined by a word line (or, a page) having the shortest life. This means that even when a memory block is classified as an unusable block, some word lines in the unusable block are still usable. Thus, when the program-erase number of a memory block reaches the guaranteed program-erase number, the memory controller 2000 manages the endurance (or, life) of the memory block of the nonvolatile memory device 1000 by word line units (or, page units), as opposed to block units. It is therefore possible to elongate the life of the nonvolatile memory device 1000, which is shortened by characteristic deterioration due to the scale-down.

In an embodiment, one or more reference program-erase number may be used to determine when a memory block has reached or is approaching its guaranteed program-erase number. For example, a reference program-erase number may be set to be smaller than the guaranteed program-erase number.

Figure 2:
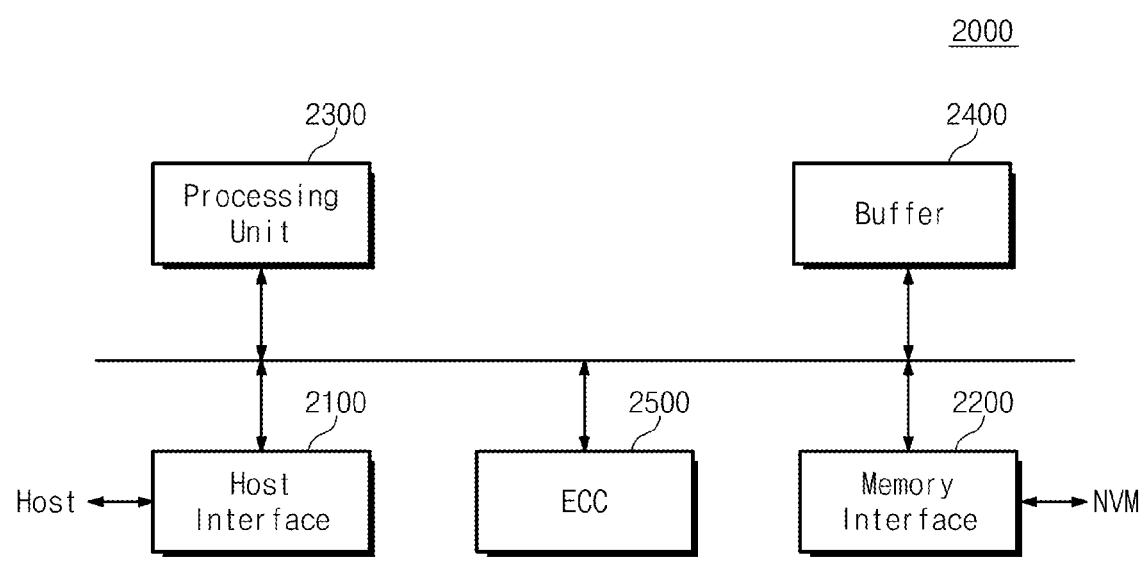
FIG. 2 is a block diagram schematically illustrating a memory controller in FIG. 1, according to an embodiment of the inventive concept.

FIG. 2 is a block diagram schematically illustrating the memory controller in FIG. 1, according to an embodiment of the inventive concept.

Referring to FIG. 2, the controller 2000 includes a host interface 2100 as a first interface, a memory interface 2200 as a second interface, a processing unit 2300, such as a central processing unit (CPU), a buffer memory 2400, and an error detecting and correcting circuit 2500. The host interface 2100 is configured to interface with an external device (for example, a host), and the memory interface 2200 is configured to interface with a nonvolatile memory device, such as nonvolatile memory device 1000 illustrated in FIG. 1. The processing unit 2300 is configured to control overall operations of the controller 2000. The processing unit 2300 may be configured to operate firmware, such as Flash Translation Layer (FTL), for example. The buffer memory 2400 temporarily stores data transferred from the external device via the host interface 2100 or data transferred from the nonvolatile memory device 1000 via the memory interface 2200. The error detecting and correcting circuit 2500 is configured to encode data to be stored in the nonvolatile memory device 1000 and to decode data read out from the nonvolatile memory device 1000. The encoding may include an operation of generating parity information, which may be generated by field units. One-page data may be formed of one or more fields.

Although not shown in FIG. 2, the memory controller 2000 may further include read only memory (ROM), which is used to store firmware, such as the FLT. In this case, the firmware in the ROM may be stored in the nonvolatile memory device 1000 controlled by the controller 2000, and may be loaded onto the controller 2000 from the nonvolatile memory device 1000 at power-up.

When the program-erase number of a specific memory block reaches (is equal to) a reference program-erase number (which is smaller than a measured/guaranteed program-erase number), the memory controller 2000 manages the life of the specific memory block by word line units, according to an embodiment of the inventive concept. That is, when the program-erase number of the specific memory block reaches the reference program-erase number, rather than setting all word lines (or, pages) of the specific memory block to an unusable state at the same time by block unit, the memory controller 200 sets individual word lines (or, pages) to an unusable state by word line (or, page) unit. Setting of word lines (or, pages) of the specific memory block to an unusable state may be performed via a fade-out technique. The fade-out technique fades-out word lines of a memory block according to various methods. For example, fade-out may be sequentially performed beginning with word lines located at edges of the memory block. Alternatively, odd/even word lines of the memory block may be faded out, and even/odd word lines of the memory block are used. Subsequently, when the program-erase number of the specific memory block reaches another reference program-erase number, odd/even word lines of the memory block are used and even/odd word lines are faded out. Alternatively, when the memory block includes dummy word lines, fading-out may be performed by replacing word lines located at edges of the memory block with the dummy word lines. Alternatively, fading-out may be performed according to a combination of at least two of the above-described fade-out methods. The above-described fade-out methods will be more fully described below.

In an embodiment, the memory controller 2000 includes a first memory management scheme for managing the life of a memory block by block unit and a second memory management scheme for managing the life of a memory block by word line unit. The first and second memory management schemes may be implemented by hardware, software, or a combination of hardware and software.

In an embodiment, when the life of a nonvolatile memory device/memory block is managed by word line unit, addresses transferred to the nonvolatile memory device during a write operation, where data is sequentially stored in at least two memory blocks of the nonvolatile memory device, may be partially discontinuous. This is because a portion of the word lines in the memory block may be faded out. In contrast, when the life of a nonvolatile memory device/memory block is managed by block unit, addresses transferred to the nonvolatile memory device during a write operation, where data is sequentially stored in at least two memory blocks of the nonvolatile memory device, may be continuous.

In an embodiment, the host interface 2100 may include one of computer bus standards, storage bus standards, and iFCP-Peripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, HyperTransport, for example. The storage bus standards may include ST-506, Enhanced Small Disk Interface (ESDI), Storage Module Device (SMD), Parallel Advanced Technology Attachment (PATA), DMA, SSA, HIPPI, Universal Serial Bus (USB) MSC, FireWire(1394), Serial Advanced Technology Attachment (SATA), eSATA, Small Computer System Interface (SCSI), Parallel SCSI, Serial Attached SCSI, Fibre Channel, iSCSI, SAS, RapidIO, FCIP, for example. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, for example.

Although not illustrated in figures, the memory controller 2000 may further include a randomizer/de-randomizer configured to randomize data to be stored in the nonvolatile memory device 1000 and to de-randomize data read from the nonvolatile memory device 1000. An example of a randomizer/de-randomizer is disclosed in U.S. Patent Application Publication No. 2010/0088574 to Yong June Kim et al., which is hereby incorporated by reference.

Figure 3:
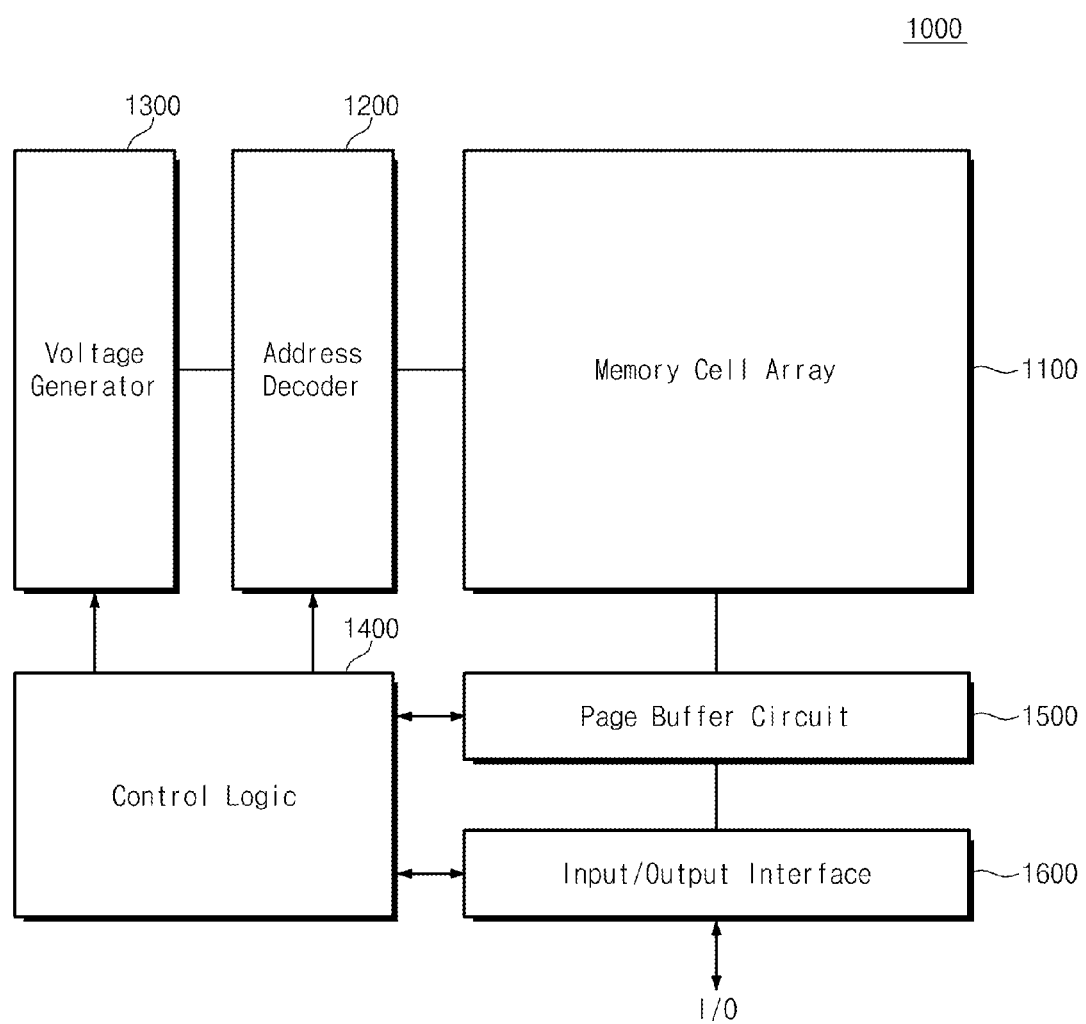
FIG. 3 is a block diagram schematically illustrating a nonvolatile memory device illustrated in FIG. 1, according to an embodiment of the inventive concept.

FIG. 3 is a block diagram schematically illustrating a nonvolatile memory device illustrated in FIG. 1, according to an embodiment of the inventive concept.

Referring to FIG. 3, nonvolatile memory device 1000 includes a memory cell array 1100, an address decoder 1200, a voltage generator 1300, control logic 1400, a page buffer circuit 1500, and an input/output interface 1600. The memory cell array 1100 includes memory cells arranged at intersections of rows (e.g., word lines) and columns (e.g., bit lines). Each memory cell may store 1-bit data or multi-bit data.

The control logic 1400 is configured to control overall operation of the nonvolatile memory device 1000. The address decoder 1200 is controlled by the control logic 1400, and performs selecting and driving operations on rows (e.g., word lines, string selection line(s), ground selection line(s), common source line, etc.) of the memory cell array 1100. The voltage generator 1300 is controlled by the control logic 1400, and generates voltages required for each operation, such as high voltage, program voltage, read voltage, verification voltage, erase voltage, pass voltage, bulk voltage, and the like. Voltages generated by the voltage generator 1300 are provided to the memory cell array 1100 via the address decoder 1200. The page buffer circuit 1500 is controlled by the control logic 1400, and is configured to read data from the memory cell array 1100 and to drive columns (e.g., bit lines) of the memory cell array 1100 according to program data. The page buffer circuit 1500 may include page buffers respectively corresponding to bit lines or bit line pairs. Each of the page buffers may include multiple latches. The input/output interface 1600 is controlled by the control logic 1400, and interfaces with an external device (e.g., a memory controller in FIG. 1).

Figure 4:
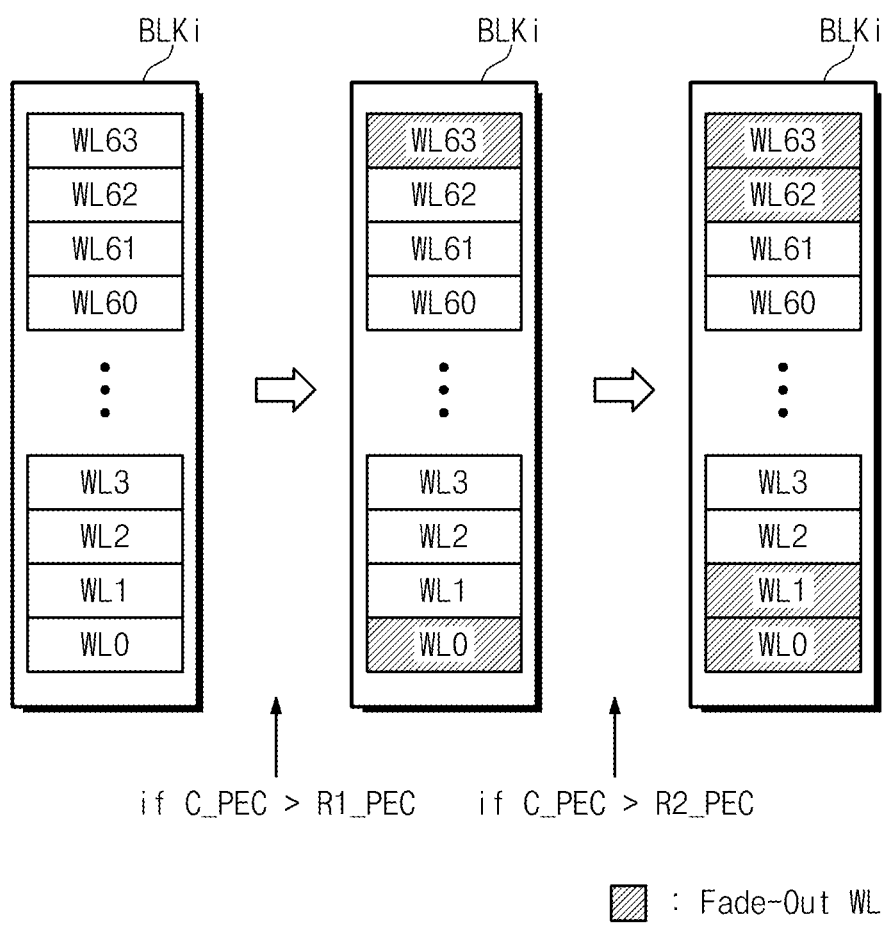
FIG. 4 is a diagram for describing a memory managing method of a memory controller, according to an embodiment of the inventive concept.

FIG. 4 is a diagram for describing a memory managing method of a memory controller, according to an embodiment of the inventive concept.

A memory managing method of a memory controller (e.g., memory controller 2000) will be described with reference to one representative memory block BLKi. However, the memory managing method according to embodiments of the inventive concept may be applied identically to all memory blocks included in a nonvolatile memory device 1000. The memory block BLKi includes multiple word lines, such as 64 word lines, for example. As discussed above, the life of the memory block BLKi is typically determined on the basis of a program-erase number (or, a guaranteed program-erase number) measured at a test level, indicating the number of program-erase cycles that the memory block BLKi is guaranteed to be able to perform.

As shown in FIG. 4, the memory controller 2000 determines whether program-erase number C_PEC of the memory block BLKi reaches a first reference program-erase number R1_PEC and a second reference program-erase number R2_PEC. The reference program-erase number R1_PEC is smaller than the previously determined guaranteed program-erase number of the memory block BLKi. In an embodiment, the program-erase number may be formed of one or more values. The program-erase number C_PEC of the memory block BLKi may be recorded in a table which is managed by the memory controller 2000. For example, the determination operation may be a background operation of the memory controller 2000, which may be performed when the memory system is in an idle state without a host request.

When the program-erase number C_PEC of the memory block is determined not to have reached the first reference program-erase number R1_PEC (C_PEC<R1_PEC), the life of the memory block BLKi is managed by block unit. When the program-erase number C_PEC of the memory block is determined to have reached (or exceeded) the first reference program-erase number R1_PEC (C_PEC>R1_PEC), the life of the memory block BLKi is managed by word line unit, as opposed to block unit. For example, when the program-erase number C_PEC of the memory block reaches the first reference program-erase number R1_PEC, as illustrated in FIG. 4, word lines (e.g., WL0 and WL63) located at edges of the memory block BLKi are faded out according to the word line unit management. Conventionally, since characteristics of the word lines located at the edges of a memory block are relatively bad compared to the characteristics of the remaining word lines, the life of the memory block is typically dictated by the word lines located at the edges. Thus, by fading out word lines (e.g., WL0 and WL63) located at the edges of the memory block BLKi and using the remaining word lines when the program-erase number C_PEC of the memory block BLKi reaches the first reference program-erase number R1_PEC, the life of the memory block BLKi may be extended.

After word lines (e.g., WL0 and WL63) located at the edges of the memory block BLKi are faded out, the memory controller 2000 determines when the program-erase number C_PEC of the memory block BLKi reaches (or exceeds) the second reference program-erase number R2_PEC. In the depicted example, the first reference program-erase number R1_PEC is smaller than the second reference program-erase number R2_PEC. When program-erase number C_PEC of the memory block BLKi reaches the second reference program-erase number R2_PEC (C_PEC>R2_PEC), as illustrated in FIG. 4, word lines (e.g., WL1 and WL62), located closes to the edges of the memory block from among the remaining word lines WL1 to WL62 (after fading-out word lines WL0 and WL63) are faded out.

In an embodiment, a memory system may be implemented such that the remaining word lines are faded out, as described above, using different respective reference program-erase numbers after the word lines WL1 and WL62 are faded out. Also, in an embodiment, word lines are faded out one by one from both edges of the memory block BLKi. However, it is understood that the inventive concept is not limited thereto. For example, word lines may be faded out by units of two or more word lines from one or both edges of the memory block BLKi.

In an embodiment, the above-described determination operation of the memory controller 2000 may start at the same time the memory system is used. Alternatively, the above-described determination operation of the memory controller 2000 may selectively start according to a term when the memory system is used.

Figure 5:
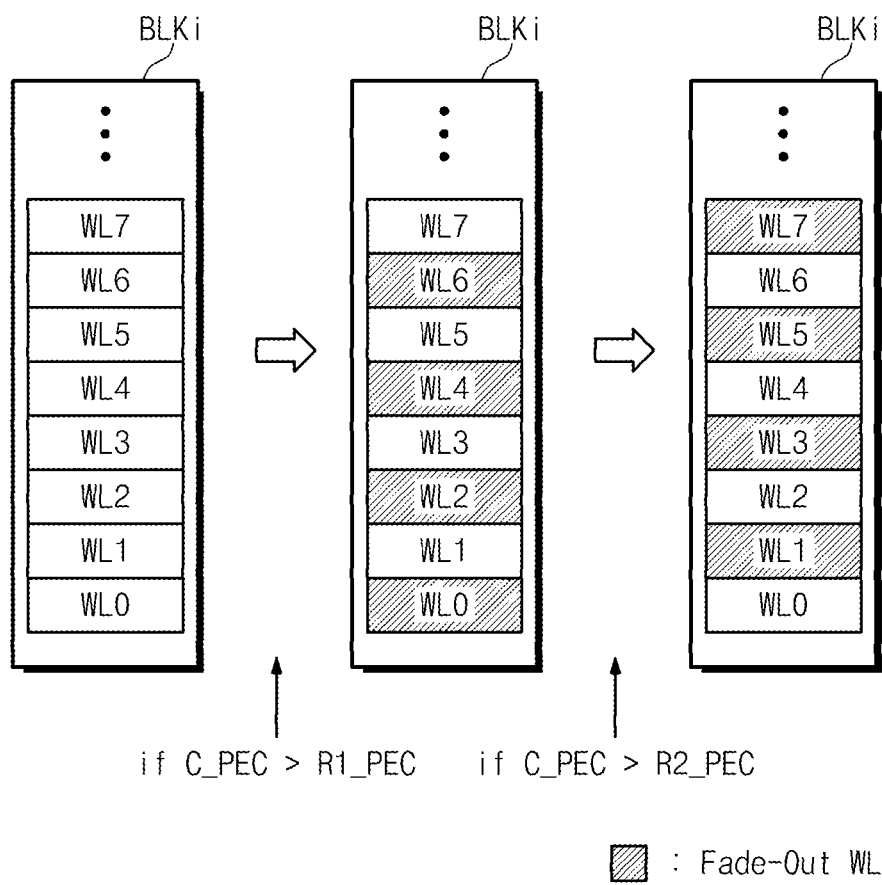
FIG. 5 is a diagram for describing a memory managing method of a memory controller, according to another embodiment of the inventive concept.

FIG. 5 is a diagram for describing a memory managing method of a memory controller, according to another embodiment of the inventive concept.

Referring to FIG. 5, the memory controller 2000 determines whether program-erase number C_PEC of the memory block BLKi reaches a first reference program-erase number R1_PEC and a second reference program-erase number R2_PEC. When the program-erase number C_PEC of the memory block is determined not to have reached the first reference program-erase number R1_PEC (C_PEC<R1_PEC), the life of the memory block BLKi is managed by block unit. When the program-erase number C_PEC of the memory block is determined to have reached (or exceeded) the first reference program-erase number R1_PEC (C_PEC>R1_PEC), the life of the memory block BLKi is managed by word line unit, as opposed to block unit. For example, as illustrated in FIG. 5, when the program-erase number C_PEC of the memory block reaches the first reference program-erase number R1_PEC, even word lines WL0, WL2, WL4, WL6, etc., of the word lines of the memory block BLKi are faded out, and odd word lines WL1, WL3, WL5, etc., are used.

After the even word lines WL0, WL2, WL4, WL6, etc., of the word lines of the memory block BLKi are faded out, the memory controller 2000 determines when the program-erase number C_PEC of the memory block BLKi reaches (or exceeds) the second reference program-erase number R2_PEC. When the program-erase number C_PEC of the memory block BLKi reaches the reference program-erase number R2_PEC (C_PEC>R2_PEC), as illustrated in FIG. 5, the even word lines WL0, WL2, WL4, WL6, etc., of word lines of the memory block BLKi are used, while the odd word lines WL1, WL3, WL5, etc., are faded out.

It is thus possible to elongate the life of a memory block/nonvolatile memory device by fading out odd/even word lines according to corresponding reference program-erase numbers. Further, it is possible to remove word line coupling noise by using only even word lines WL0, WL2, WL4, WL6, etc., of the word lines of the memory block BLKi or only odd word lines WL1, WL3, WL5, etc., of the word lines of the memory block BLKi.

Figure 6:
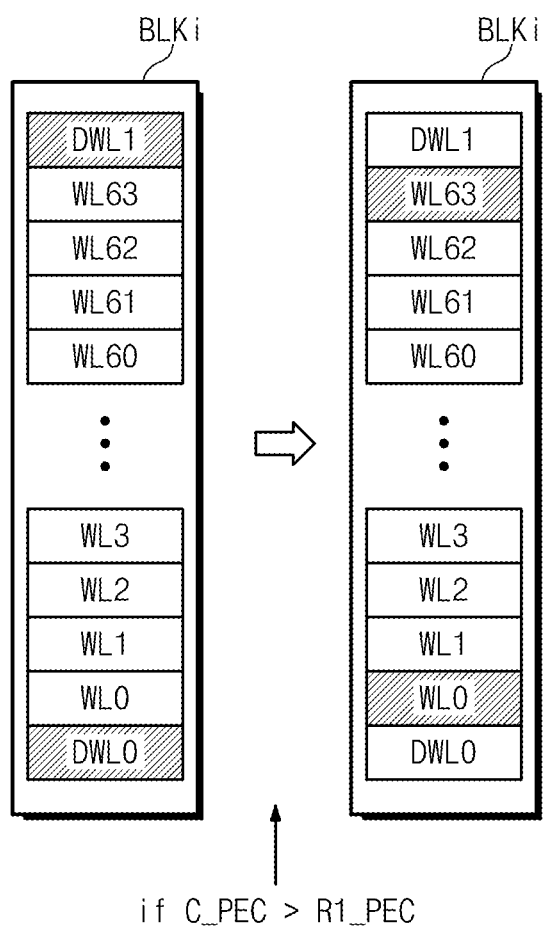
FIG. 6 is a diagram for describing a memory managing method of a memory controller, according to still another embodiment of the inventive concept.

FIG. 6 is a diagram for describing a memory managing method of a memory controller, according to still another embodiment of the inventive concept.

Referring to FIG. 6, memory block BLKi includes dummy word lines DWL0 and DWL1 arranged at both edges, and multiple word lines (e.g., WL0 through WL63) arranged between the dummy word lines DWL0 and DWL1. Memory cells connected to the dummy word lines DWL0 and DWL1 are the same as memory cells connected to the word lines WL0 through WL63, although data is not stored in the memory cells connected to the dummy word lines DWL0 and DWL1 during ordinary operations.

The memory controller 2000 determines whether program-erase number C_PEC of the memory block BLKi reaches a reference program-erase number R1_PEC. When the program-erase number C_PEC of the memory block is determined not to have reached the reference program-erase number R1_PEC (C_PEC<R1_PEC), the life of the memory block BLKi is managed by block unit. When the program-erase number C_PEC of the memory block is determined to have reached (or exceeded) the reference program-erase number R1_PEC (C_PEC>R1_PEC), the life of the memory block BLKi is managed by word line unit, as opposed to block unit. For example, when the program-erase number C_PEC of the memory block reaches the reference program-erase number R1_PEC, as illustrated in FIG. 6, the memory controller 2000 fades out word lines WL0 and WL63 located at both edges of the memory block BLKi and uses the dummy word lines DWL0 and DWL1 in place of the faded-out word lines WL0 and WL63. That is, memory cells connected to the dummy word lines DWL0 and DWL1 are used to store data that would otherwise be stored in memory cells connected to the faded-out word lines WL0 and WL63. Although not shown, the remaining word lines WL1 through WL62 may then be faded out in the same manner as described above with reference to FIG. 4, for example.

Memory managing techniques according to embodiments of the inventive concept may be applied to various memory devices. This will be more fully described below.

Figure 7A:
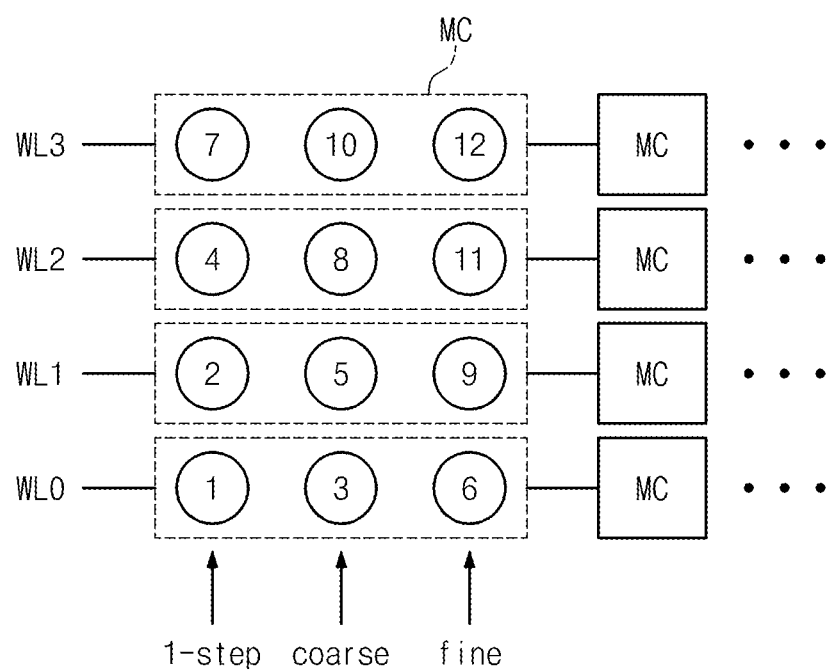
FIG. 7A is a diagram illustrating an example of an address scramble method applied to a multi-level memory device, according to an embodiment of the inventive concept.

FIG. 7A is a diagram illustrating an example of an address scramble method applied to a multi-level memory device, according to an embodiment of the inventive concept.

As the number of data bits stored in each memory cell increases, it becomes more difficult to ensure reliability of the memory device storing the multi-bit (or, multi-level) data (hereinafter referred to as a multi-level memory device). Variation in threshold voltages due to coupling between adjacent memory cells is an example of a potential cause of degraded reliability. For example, the threshold voltage of a previously programmed memory cell may vary due to coupling caused when a memory cell adjacent to the programmed memory cell is programmed.

For purposes of describing the address scramble method, it is assumed that 3-bit data is stored in one memory cell. For ease of illustration, FIG. 7A shows only four word lines WL0 to WL3. Multiple memory cells MC are connected to each of the four word lines WL0 to WL3, although only one memory cell MC for each word lines is expanded to show the programming operation of the multiple bits. First, a 1-step program operation is performed for storing lower 2-bit data in each memory cell in the first word line WL0. That is, during the 1-step program operation, 2-page data are stored in the memory cells connected with the first word line WL0. This is marked by ① in FIG. 7A. Then, a 1-step program operation is performed with respect to memory cells connected to the second word line WL1. This is marked by ② in FIG. 7A. After the 1-step program operation is performed with respect to the memory cells connected to the second word line WL1, a 2-step program operation (referred to as a coarse program operation) is performed with respect to the first word line WL0, which is placed below the second word line WL1, for storing an upper 1-bit data. This is marked by ③ in FIG. 7A. Following the coarse program operation of memory cells connected to the first word line WL0, a 1-step program operation is performed with respect memory cells connected to the third word line WL2. This is marked by ④ in FIG. 7A. After the 1-step program operation for the third word line WL2, a coarse program operation is performed with respect to the memory cells connected to the second word line WL1, for storing upper 1-bit data in the memory cells connected to the second word line WL1 programmed the lower 2-bit data. This is marked by ⑤ in FIG. 7A. Subsequently, a fine program operation is performed on the first word line WL0. This is marked by ⑥ in FIG. 7A. Subsequently, the 1-step, coarse and fine program operations are performed sequentially according to the above-described program order (refer to FIG. 7A). A manner in which word lines are selected according to the program order described in FIG. 7A is called an address scramble manner, although the sequence and manner in which the address scramble is performed is not limited to this example.

When the 1-step program operation and the coarse program operation are completed, threshold voltage distributions (e.g., $2^M$ threshold voltage distributions) respectively corresponding to M-bit data (M being an integer greater than or equal to 2) are all formed. Although the threshold voltage distributions are formed upon completion of the coarse program operation, margins between threshold voltage distributions are insufficient to distinguish threshold voltage distributions exactly. The fine program operation is carried out to secure margins sufficient to distinguish threshold voltage distributions exactly. The fine program operation is therefore executed to narrow the width of each threshold voltage distribution. During the fine program operation, verification voltages are used which are higher by a predetermine voltage than verification voltages of threshold voltage distributions used during the coarse program operation. It is possible to reduce the coupling between adjacent memory cells through the above-described program method, which is referred to as a reprogram method/algorithm.

In exemplary embodiments, the above-described reprogram method for 3-bit data, including 1-step programming, coarse programming and fine programming, may be applied to a reprogram method for other multi-bit data, such as 2-bit data and 4-bit data.

With the reprogram method, it is necessary to retain data stored in memory cells in an arbitrary word line until the fine program operation is completed for the arbitrary word line. For example, the 1-step program operation is performed depending upon data provided to a multi-bit memory device from a memory controller, and the coarse program operation is performed depending upon data stored through the 1-step program operation and data provided from the memory controller. The fine program operation is performed depending upon data stored through the 1-step and coarse program operations.

However, as described above, it is difficult to exactly read data stored through the 1-step and coarse program operations. This means that data necessary for the fine program operation must be provided to the multi-bit memory device from the memory controller. For this reason, the memory controller necessitates retaining data stored in memory cells in an arbitrary word line until the fine program operation is completed for the arbitrary word line. This means that a large buffer memory is provided to the memory controller in order to retain data needed for the fine program operation. For example, an On-chip Buffered Programming (OBP) technique may be applied to a memory system to reduce the capacity of a buffer memory. This will be more fully described below.

Figure 7B:
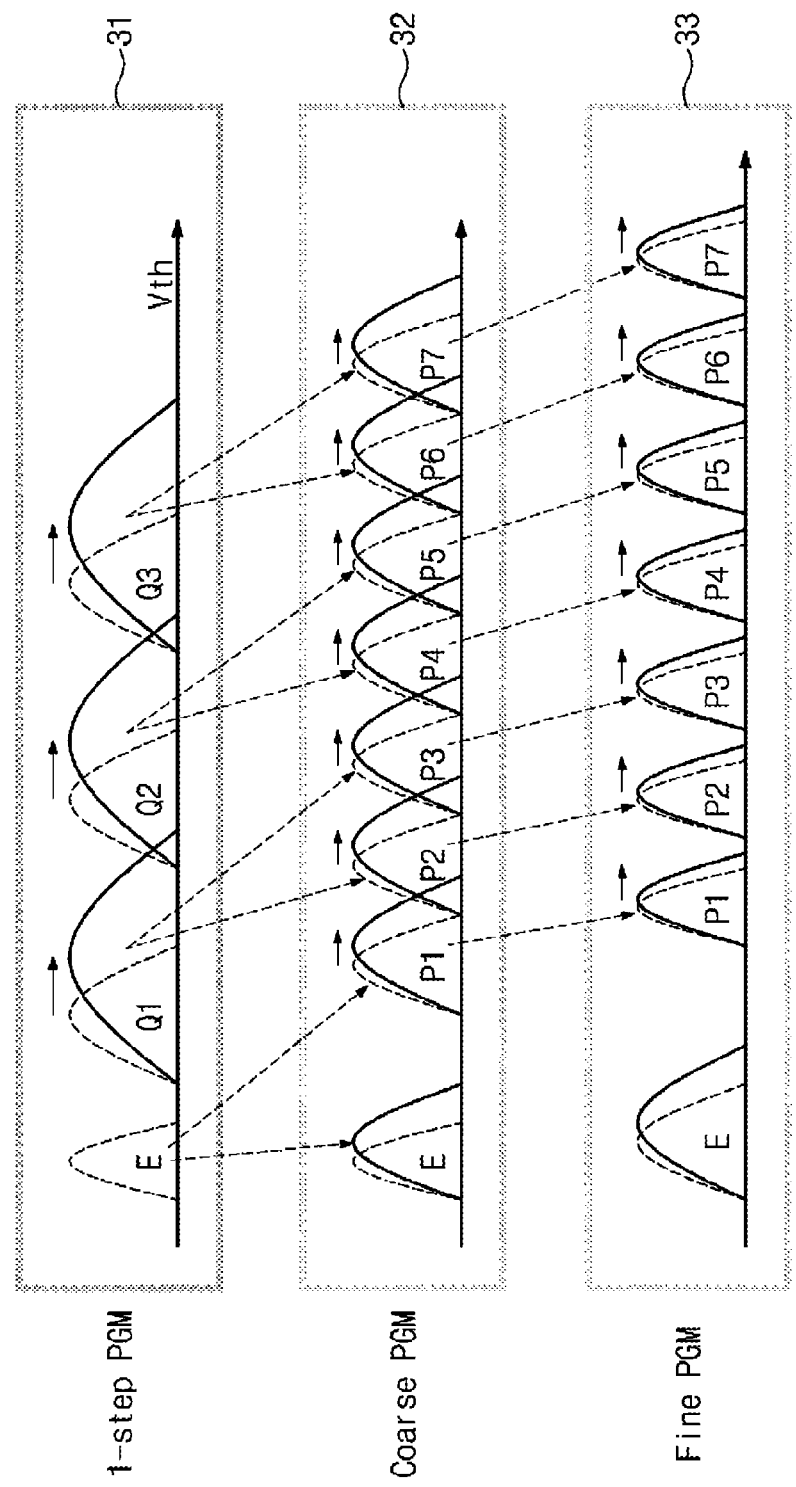
FIG. 7B is a diagram illustrating threshold voltage distributions varying during a program operation according to 3-step programming to store 3-bit data in each memory cell, according to an embodiment of the inventive concept.

FIG. 7B is a diagram showing variations in threshold voltage distributions when a program operation is performed according to 3-step programming to store 3-bit data in each memory cell, according to an embodiment of the inventive concept.

Referring to FIG. 7B, 2-page data (i.e., first and second page data) is stored in memory cells of a selected word line (e.g., WL0 in FIG. 7A) at the same time. At this time, as illustrated in a box 31 of FIG. 7B, memory cells in a threshold voltage distribution corresponding to an erase state E may be programmed to have threshold voltages in threshold voltage distributions corresponding to program states Q1, Q2, and Q3, respectively, based on the data to be programmed.

As described above, a coarse program operation of 1-step programmed memory cells in a word line (e.g., WL0) is executed after a 1-step program operation of memory cells in an adjacent word line (e.g., WL1). At this time, as illustrated in a box 31 of FIG. 7B, distributions of 1-step programmed memory cells in the word line (e.g., WL0) widen due to coupling caused when memory cells in the adjacent word line (e.g., WL1) are programmed.

Then, 1-page data may be stored in memory cells of the selected word line WL0. At this time, as illustrated in a box 32 of FIG. 7B, memory cells in a threshold voltage distribution corresponding to each state may be programmed to have threshold voltages in corresponding threshold voltage distributions. For example, memory cells in a threshold voltage distribution corresponding to the erase state E may be programmed to have threshold voltages in a threshold voltage distribution corresponding to a program state P1, based on the data to be programmed. Memory cells in a threshold voltage distribution corresponding to the program state Q1 may be programmed to have threshold voltages in threshold voltage distributions respectively corresponding to program states P2 and P3, based on the data to be programmed. Memory cells in a threshold voltage distribution corresponding to the program state Q2 may be programmed to have threshold voltages in corresponding threshold voltage distributions to program states P4 and P5, based on the data to be programmed. Memory cells in a threshold voltage distribution corresponding to the program state Q3 may be programmed to have threshold voltages in corresponding threshold voltage distributions to program states P6 and P7, based on the data to be programmed.

As described above, a fine program operation of coarse programmed memory cells in a word line (for example, WL0) may be executed after a 1-step program operation and a coarse program operation on adjacent word lines (e.g., WL2 and WL1). At this time, as illustrated by a box 32 of FIG. 7B, distributions of coarse programmed memory cells in the word line (e.g., WL0) widen due to coupling caused when memory cells in the adjacent word lines (e.g., WL2 and WL1) are programmed. For this reason, it is difficult to exactly read data from coarse programmed memory cells.

Memory cells in the word line WL0 may be programmed to have final threshold voltage distributions P1 to P7 as illustrated in a box 33 of FIG. 7B. This operation is referred to as the fine program operation. As described above, the fine program operation requires previously programmed data (e.g., first to third page data). Since it is difficult to read previously programmed data from memory cells in the word line WL0, the fine program operation may be performed based on data provided from the memory controller (or, data maintained by a memory device). As illustrated in a box 33 of FIG. 7B, distributions of fine programmed memory cells widen due to the coupling caused when memory cells in adjacent word lines are programmed.

Subsequently, a 1-step program operation, a coarse program operation, and a fine program operation are performed on each word line according to a program order (or, sequence) described in FIG. 7A, which will be executed in the same manner as described with reference to FIG. 7B.

Figure 8:
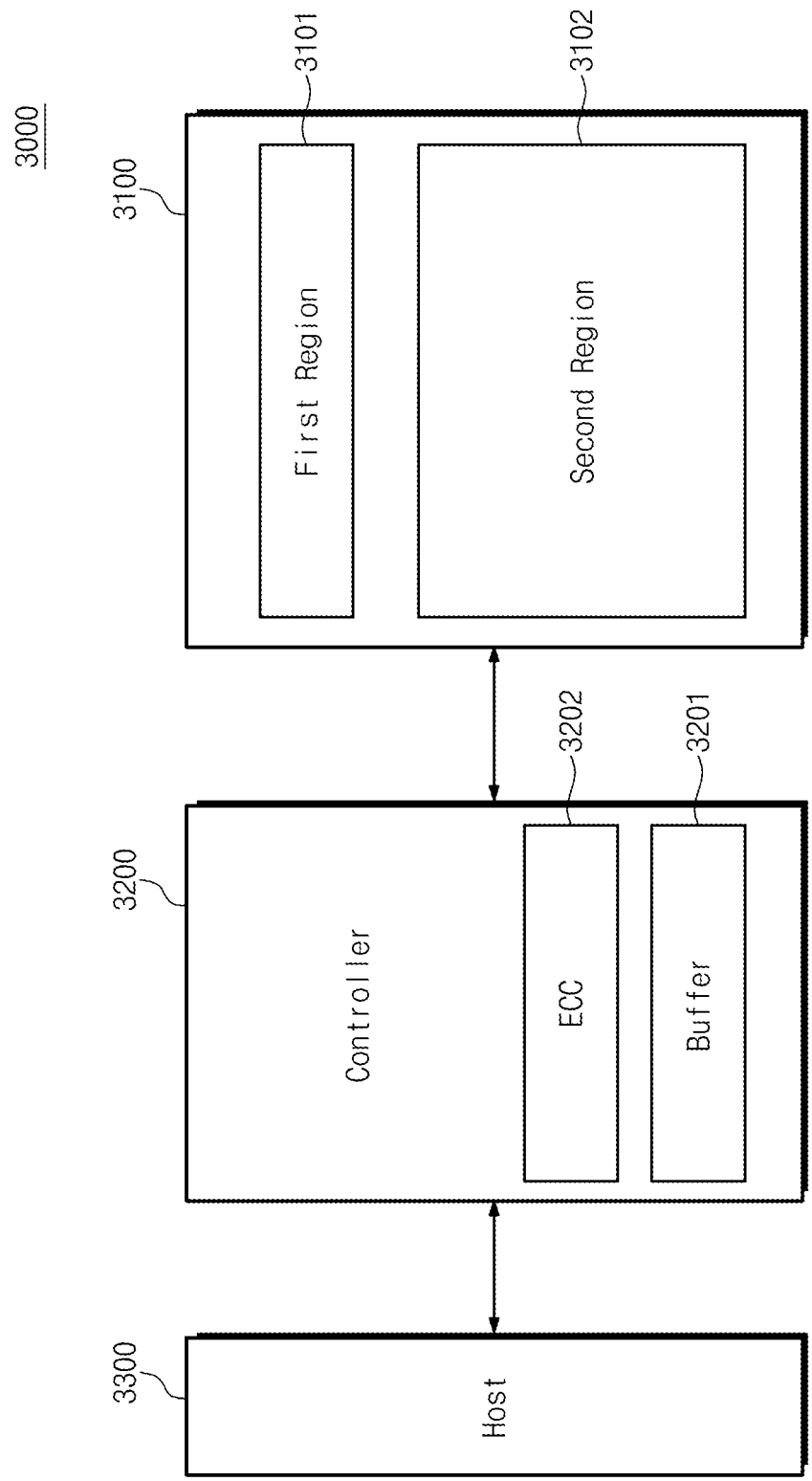
FIG. 8 is a block diagram illustrating a data storage system, according to an embodiment of the inventive concept.

FIG. 8 is a block diagram showing a data storage system, according to an embodiment of the inventive concept.

Referring to FIG. 8, a data storage system 3000 includes a memory device 3100, including multi-bit memory, such as a non-volatile memory device, a memory controller 3200, and a host 3300. The memory device 3100 may be formed of one or more memory chips. As a data storage device or a memory system, the memory device 3100 and the memory controller 3200 may constitute a memory card, a Solid State Drive (SSD), a memory stick, or the like. The memory device 3100 includes a multiple memory blocks (or, sectors/banks), each of which has memory cells arranged in rows and columns. Each of the memory cells may store multi-bit (or, multi-level)

data. The memory cells may be arranged to have a 2-dimensional array structure or a 3-dimensional/vertical array structure. Examples of a 3-dimensional array structure are disclosed in U.S. Patent Application Publication No. 2008/0023747 to Ki-Tae Park et al. and U.S. Patent Application Publication No. 2008/0084729 to Hoo-Sung Cho et al., which are hereby incorporated by reference.

In an embodiment, m blocks of the memory device 3100 are divided into a first memory region 3101 and a second memory region 3102. It is understood that division of the first and second memory regions 3101 and 3102 may be made logically, not physically. Division of the first and second memory regions 3101 and 3102 can also be changed logically. Memory blocks in the first memory region 3101 are programmed in a manner different from memory blocks in the second memory region 3102. For example, memory blocks in the first memory region 3101 may be programmed according to a single-bit program method (hereinafter, referred to as a single-level cell (SLC) program method), and memory blocks in the second memory region 3102 may be programmed according to a multi-bit program method (hereinafter, referred to as a multi-level cell (MLC) program method). In other words, each memory cell in the first memory region 3101 stores 1-bit data, while each memory cell in the second memory region 3102 stores M-bit data (M being an integer greater than or equal to 2). As a result, data bits stored in each memory cell in the first memory region 3101 are less than M-bit data stored in each memory cell in the second memory region 3102.

Continuing to refer to FIG. 8, the memory controller 3200 is configured to control the memory device 3100 in response to requests of the host 3300. The memory controller 3200 includes a buffer memory 3201 and an ECC block 3202. The buffer memory 3201 is used to temporarily store data sent from the host 3300 and data read out from the memory device 3100. The ECC block 3202 is configured to encode data to be stored in the memory device 3100 and to decode data read out from the memory device 3100. The encoding may include an operation of generating parity information, and the parity information may be generated by field unit. One-page data may be formed of one or more fields. The decoding may include an error detecting and correcting operation.

The memory controller 3200 controls program operations of the memory device 3100 in a static scheduling manner. For example, when data of the minimum program unit for the first memory region 3101 is stored in the buffer memory 3201, the memory controller 3200 controls the memory device 3100 such that data of the minimum program unit is stored (or, programmed) in the first memory region 3101. This is called a buffer program operation. When data of the minimum program unit for the second memory region 3102 is gathered at the first memory region 3101, the memory controller 3200 controls the memory device 3100 such that data of the minimum program unit for the second memory region 3102 is stored (or, programmed) in the second memory region 3102. This is called a main program operation. The buffer program operation and the main program operation may constitute an On-chip Buffered Programming (OBP) operation, for example.

It is possible to extend the life of the first memory region (or, SLC region) using one of the memory managing techniques described above with reference to FIGS. 4 through 6 or a combination of at least two thereof. It is possible to minimize the size of the first memory region by extending the life of the first memory region. This means that the chip size may be reduced. Further, it is possible to manage the second memory region (or, MLC region) using one of memory managing techniques described in relation to FIGS. 4 through 6 or a combination of at least two thereof.

In an exemplary embodiment, the minimum program unit for the first memory region 3101 and the minimum program unit for the second memory region 3102 may be decided variously depending upon the program manner, the bit-per-cell number, and the like. The minimum program unit for the first memory region 3101 is different from the minimum program unit for the second memory region 3102.

In an exemplary embodiment, it is possible to minimize the size of the buffer memory 3201 of the memory controller 3200 by storing data in the first memory region 3101 through the buffer program operation and storing data in the second memory region 3102 through the main program operation. In other words, it is unnecessary to retain data for a fine program operation in the buffer memory 3201. Accordingly, the size of the buffer memory 3201 of the memory controller 3200 may be minimized.

FIGS. 9A to 9D are block diagrams for describing various combinations of first and second memory regions of a memory device (e.g., memory device 3100), according to embodiments of the inventive concept. In FIGS. 9A to 9D, "BP" indicates buffer programming in the first memory region 3101, and "MP" indicates main programming in the second memory region 3102.

As described above, the memory device 3100 includes the first memory region 3101, the second memory region 3102 and page buffer 3103. Herein, the first and second memory regions 3101 and 3102 constitute a memory cell array of the memory device 3100, and the page buffer 3103 is provided for reading data and driving columns (e.g., bit lines) of the memory cell array. Although not illustrated in figures, the memory cell array may further include additional regions, such as a meta region, a reserved region, and the like. It is understood that regions of the memory cell array may be divided logically, not physically. This means that such regions of the memory cell array are defined according to address mapping of the memory controller 3200.

Figure 9A:
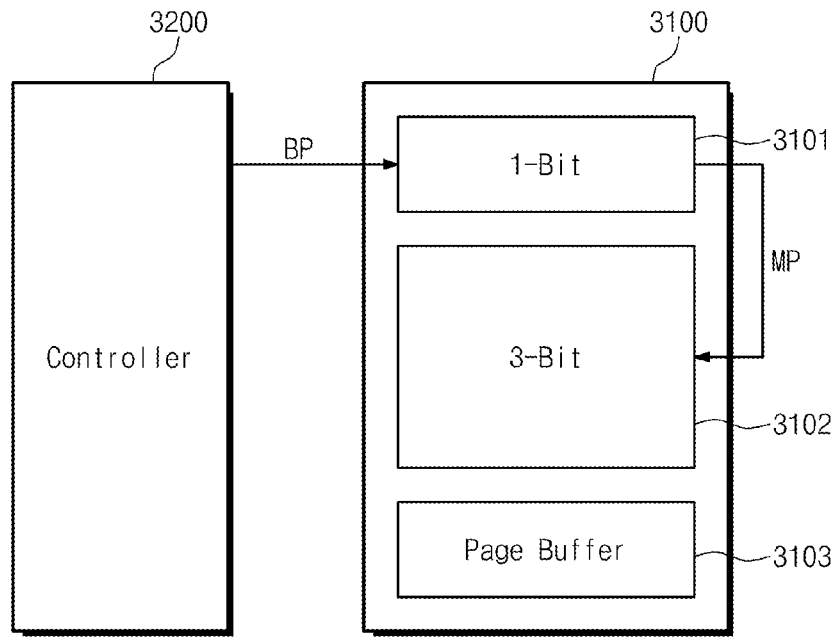
FIGS. 9A to 9D are block diagrams illustrating various combinations on first and second memory regions of a multi-bit memory device, according to embodiments of the inventive concept.

Referring to FIG. 9A, in case of a memory device which stores 3-bit data per cell, the first memory region 3101 is formed of memory cells each storing 1-bit data, and the second memory region 3102 is formed of memory cells each storing 3-bit data. In this case, buffer programming may be executed according to an SLC program method, and main programming may be executed according to the above-described MLC program method.

Figure 9B:
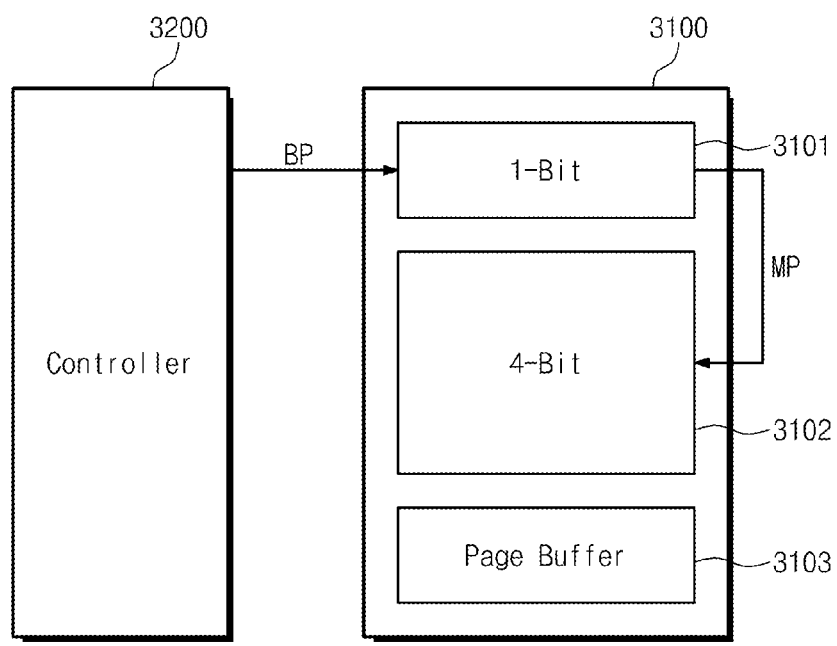

Referring to FIG. 9B, in case of a memory device which stores 4-bit data per cell, the first memory region 3101 is formed of memory cells each storing 1-bit data, and the second memory region 3102 is formed of memory cells each storing 4-bit data. In this case, buffer programming may be executed according to an SLC program method, and main programming may be executed according to the above-described MLC program method.

Figure 9C:
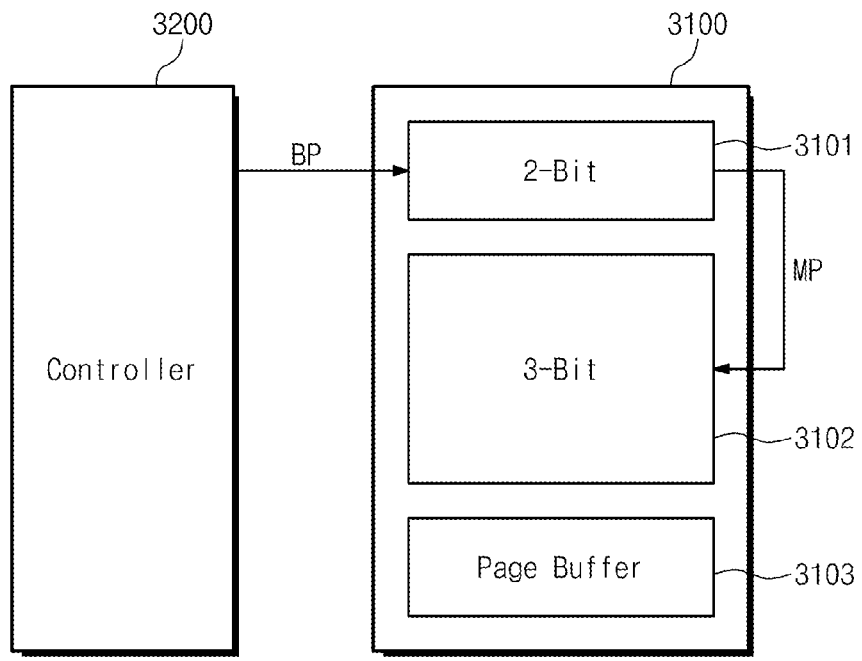

Referring to FIG. 9C, in case of a memory device which stores 3-bit data per cell, the first memory region 3101 is formed of memory cells each storing 2-bit data, and the second memory region 3102 is formed of memory cells each storing 3-bit data. In this case, buffer programming may be executed according to the above-described or conventional MLC program method, and main programming may be executed according to the above-described MLC program method (e.g., a reprogram method).

Figure 9D:
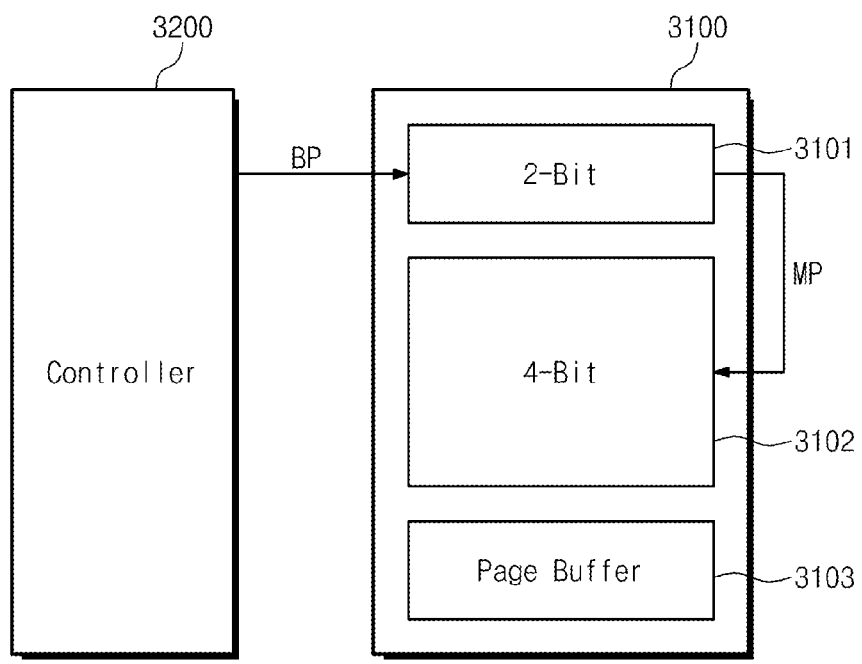

Referring to FIG. 9D, in case of a memory device which stores 4-bit data per cell, the first memory region 3101 is formed of memory cells each storing 2-bit data, and the second memory region 3102 is formed of memory cells each storing 4-bit data. In this case, buffer programming may be executed according to the above-described or conventional MLC program method, and main programming executed may be executed according to the above-described MLC program method (e.g., a reprogram method).

It is understood that defining the first and second memory regions 3101 and 3102 illustrated in FIGS. 9A to 9D is not limited to this disclosure. For example, when a storage media included in a data storage device is formed of multiple multi-bit memory devices, the first and second memory regions 3101 and 3102 may be defined with respect to the respective multi-bit memory devices. Alternatively, the first memory region 3101 may be defined with respect to any one of the multi-bit memory devices. Alternatively, any one multi-bit memory device may be defined as the first memory region 3101.

Figure 10:
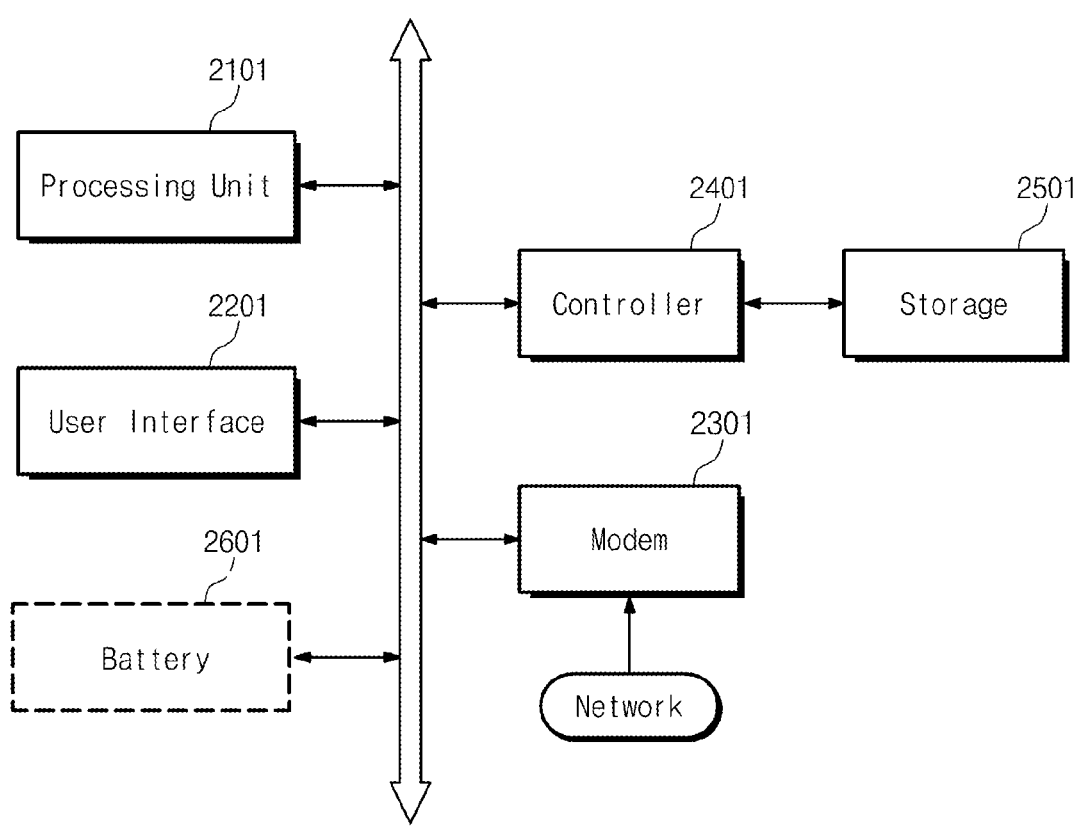
FIG. 10 is a block diagram illustrating a computing system, according to an embodiment of the inventive concept.

FIG. 10 is a block diagram showing a computing system, including a memory system, according to an embodiment of the inventive concept.

Referring to FIG. 10, the computing system includes a processing unit 2101, a user interface 2201, a modem 2301 such as a baseband chipset, a memory controller 2401, and a nonvolatile memory device 2501 as a storage media. The memory controller 2401 and the nonvolatile memory device 2501 provide a memory system according to embodiments of the present inventive concept, such as that illustrated in FIG. 1. That is, the memory controller 2401 manages the life of the nonvolatile memory device 2501 according to a memory managing technique, e.g., described in relation to FIG. 4, 5, or 6, when the program-erase number of a memory block in the nonvolatile memory device 2501 reaches a reference program-erase number. N-bit data (N being an integer greater than or equal to 1) processed/to be processed by the processing unit 2101 is stored in the nonvolatile memory device 2501 through the memory controller 2401. In the event that the computing system is a mobile device, a battery 2601 is further included in the computing system to supply operating voltage. Although not illustrated in FIG. 10, the computing system may further include an application chipset, a camera image processor (CIS), a mobile DRAM, and the like.

Figure 11:
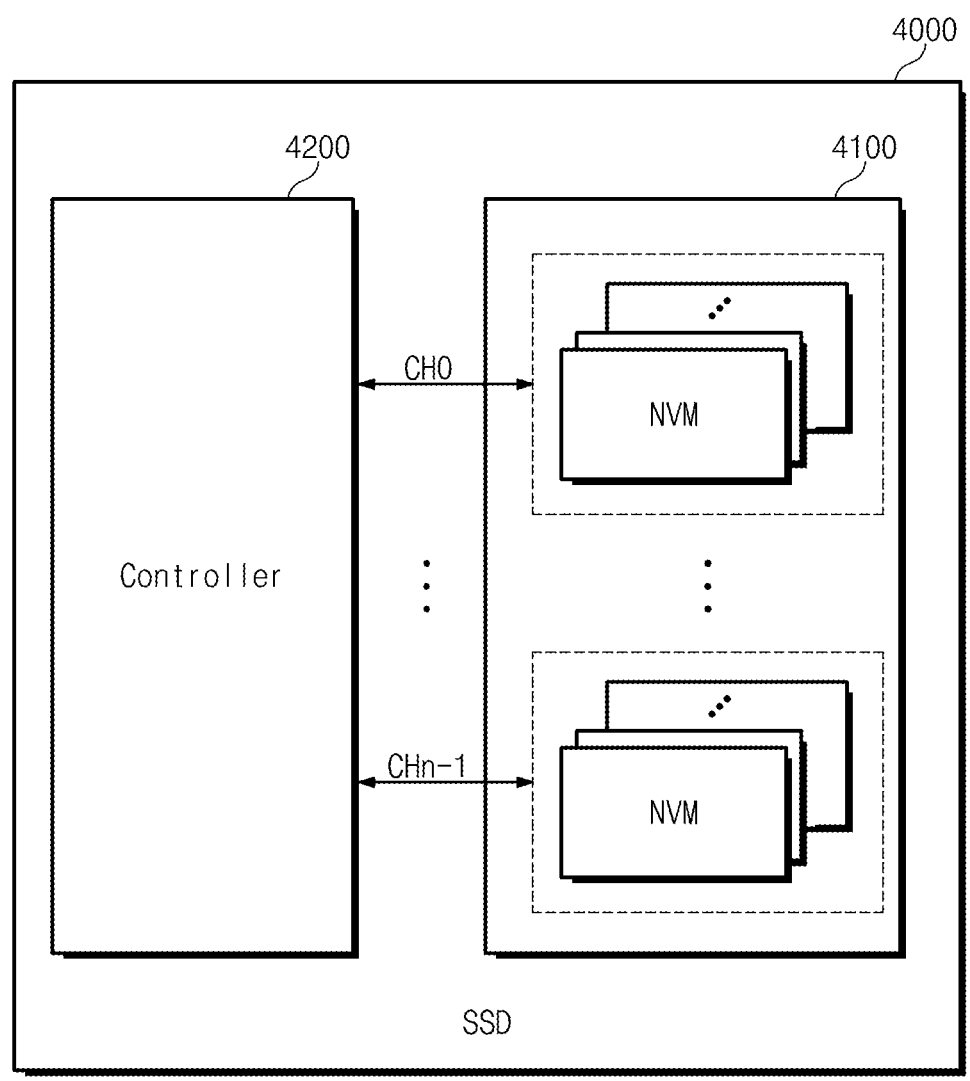
FIG. 11 is a block diagram illustrating a solid state drive, according to an embodiment of the inventive concept.

FIG. 11 is a block diagram showing a solid state drive, according to an embodiment of the inventive concept.

Referring to FIG. 11, a solid state drive (SSD) 4000 includes a storage media 4100 and a controller 4200. The storage media 4100 are connected with the controller 4200 via multiple channels CH0 to CHn-1, each of which is connected in common to multiple nonvolatile memories. The memory controller 4200 may be configured the same as illustrated in FIG. 1, for example. That is, the memory controller 4200 manages the life of each nonvolatile memory device according to a memory managing technique, e.g., described in relation to FIG. 4, 5, or 6, when the program-erase number of a memory block in each nonvolatile memory device reaches a reference program-erase number.

Figure 12:
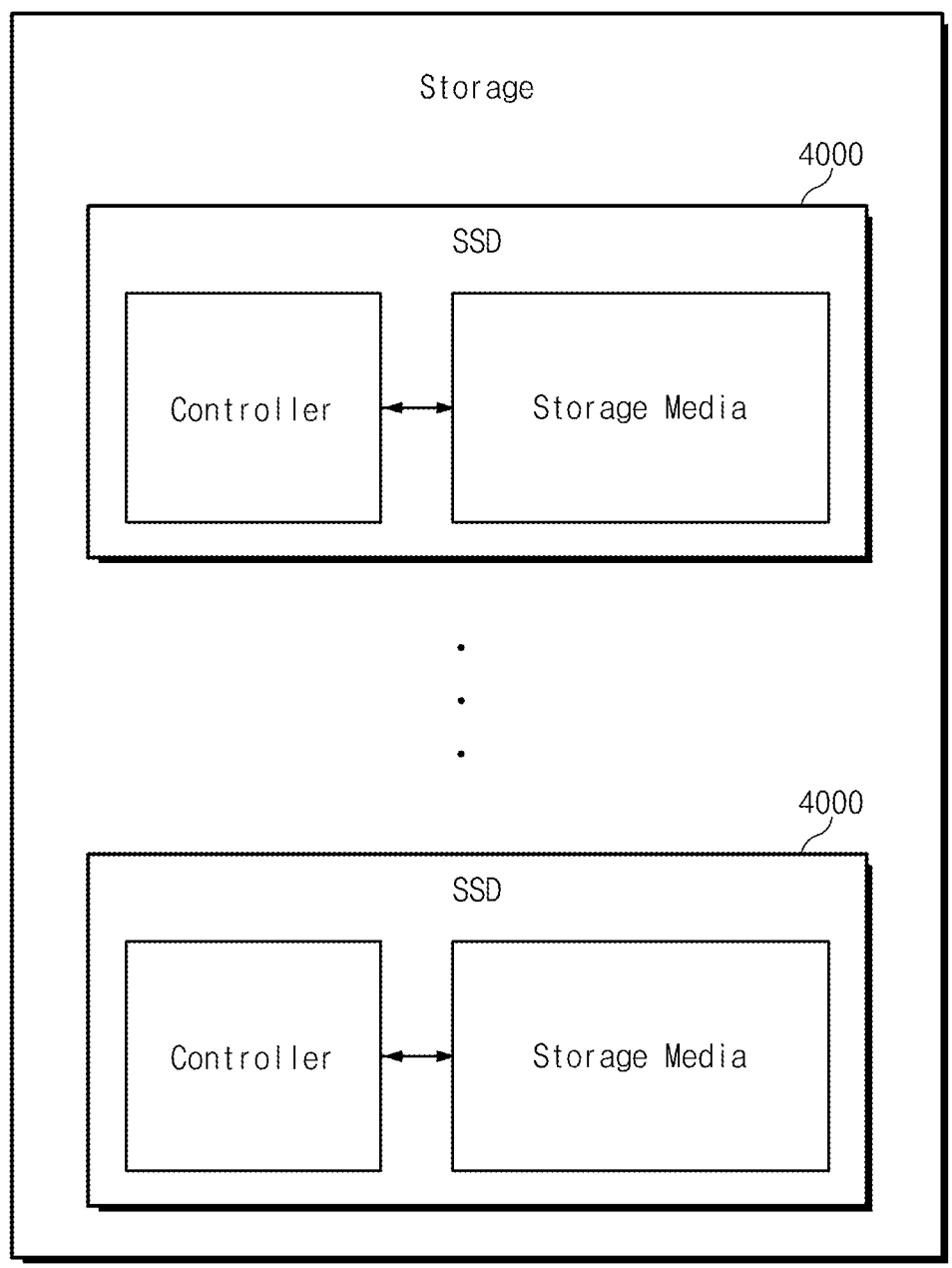
FIG. 12 is a block diagram illustrating a storage using a solid state drive in FIG. 11, according to an embodiment of the inventive concept.
Figure 13:
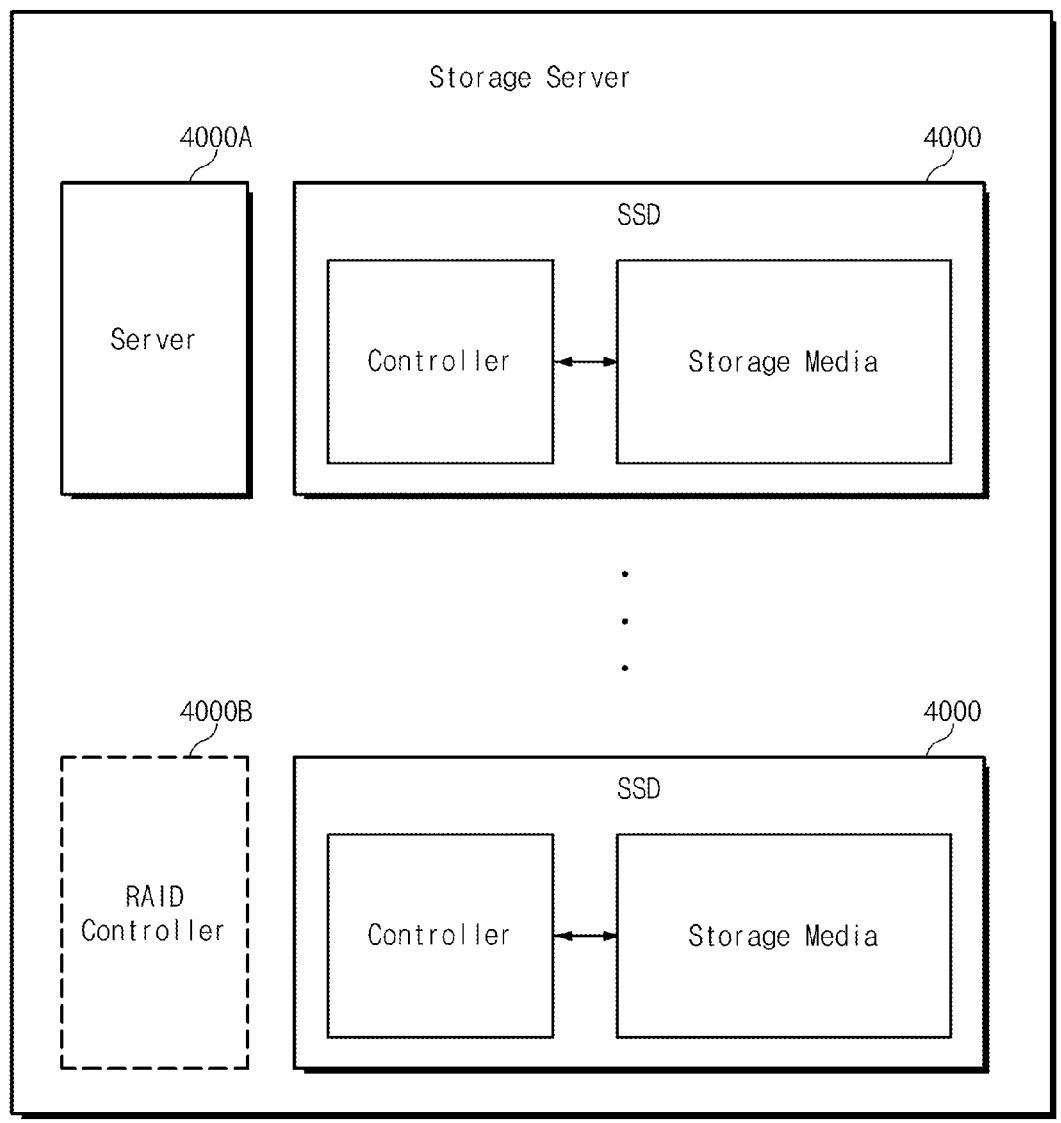
FIG. 13 is a block diagram illustrating a storage server using a solid state drive in FIG. 11, according to an embodiment of the inventive concept.

FIG. 12 is a block diagram showing storage using the solid state drive shown in FIG. 11, and FIG. 13 is a block diagram showing a storage server using the solid state drive in FIG. 11, according to embodiments of the inventive concept.

An SSD 4000 according to an exemplary embodiment of the inventive concept may be used to form the storage. As illustrated in FIG. 12, the storage includes a multiple solid state drives 4000 which are configured the same as described in FIG. 11, for example. An SSD 4000 according to an embodiment of the inventive concept is used to configure a storage sever. As illustrated in FIG. 13, a storage server includes multiple solid state drives 4000, which are configured the same as described in FIG. 11, for example, and a server 4000A. Further, it is understood that a well-known RAID controller 4000B may be provided in the storage server.

Figure 14:
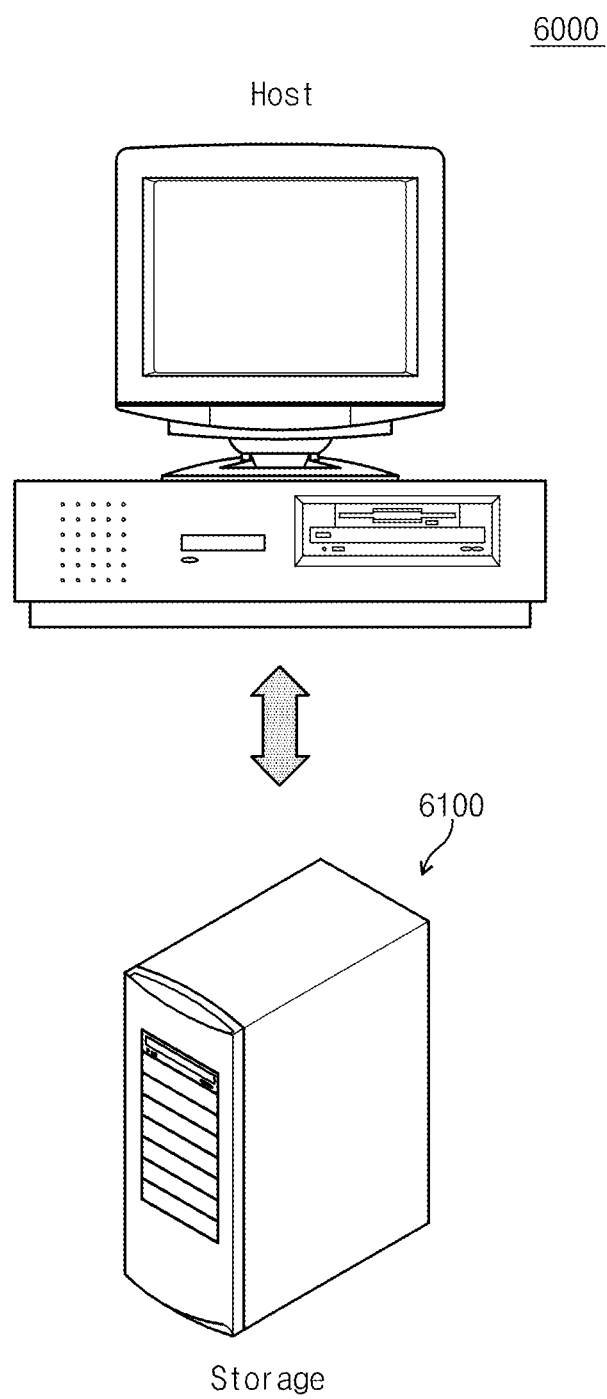
FIGS. 14 to 16 are block diagrams illustrating systems to which a data storage device according to embodiments of the inventive concept is applied.
Figure 15:
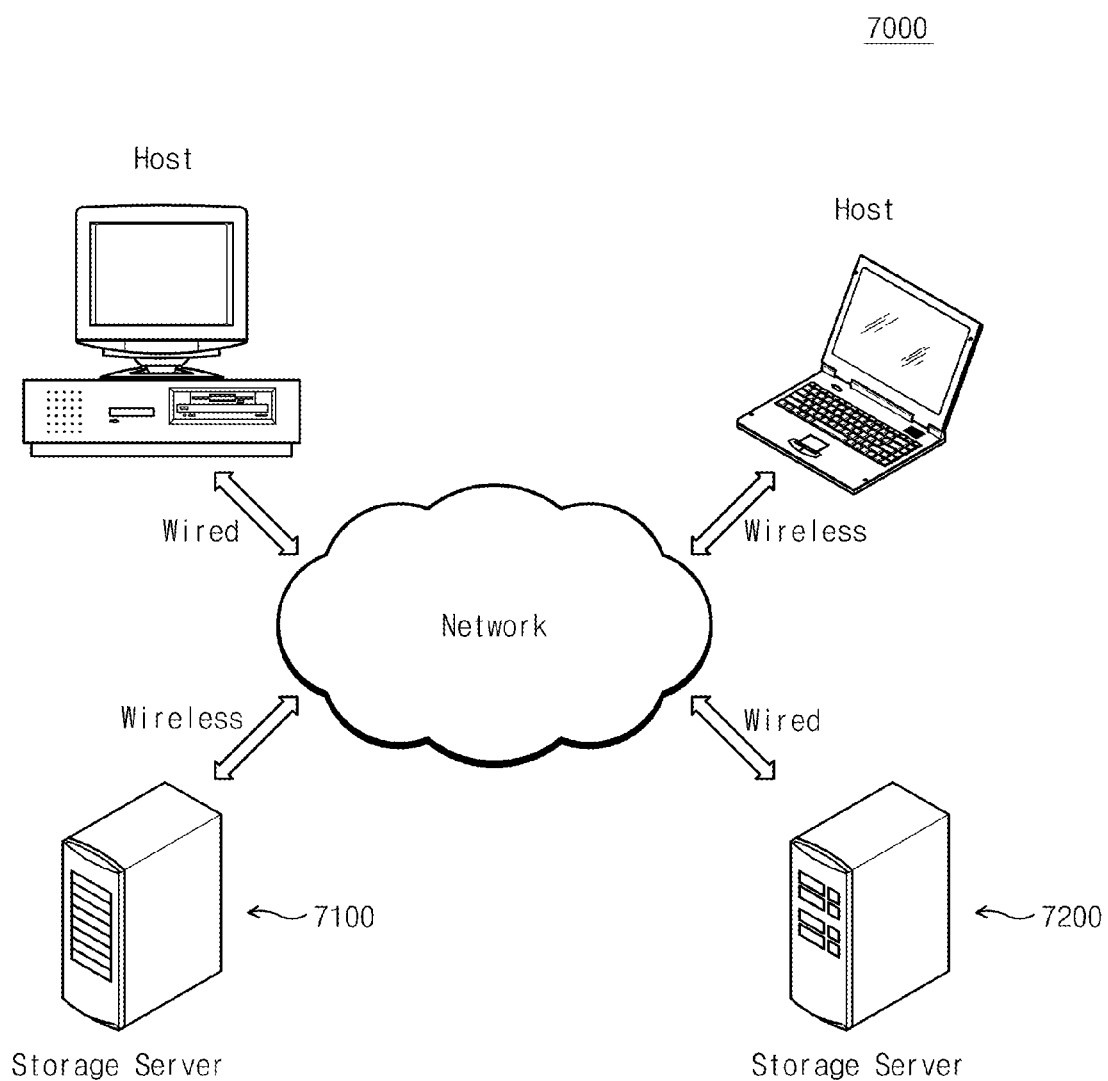
Figure 16:
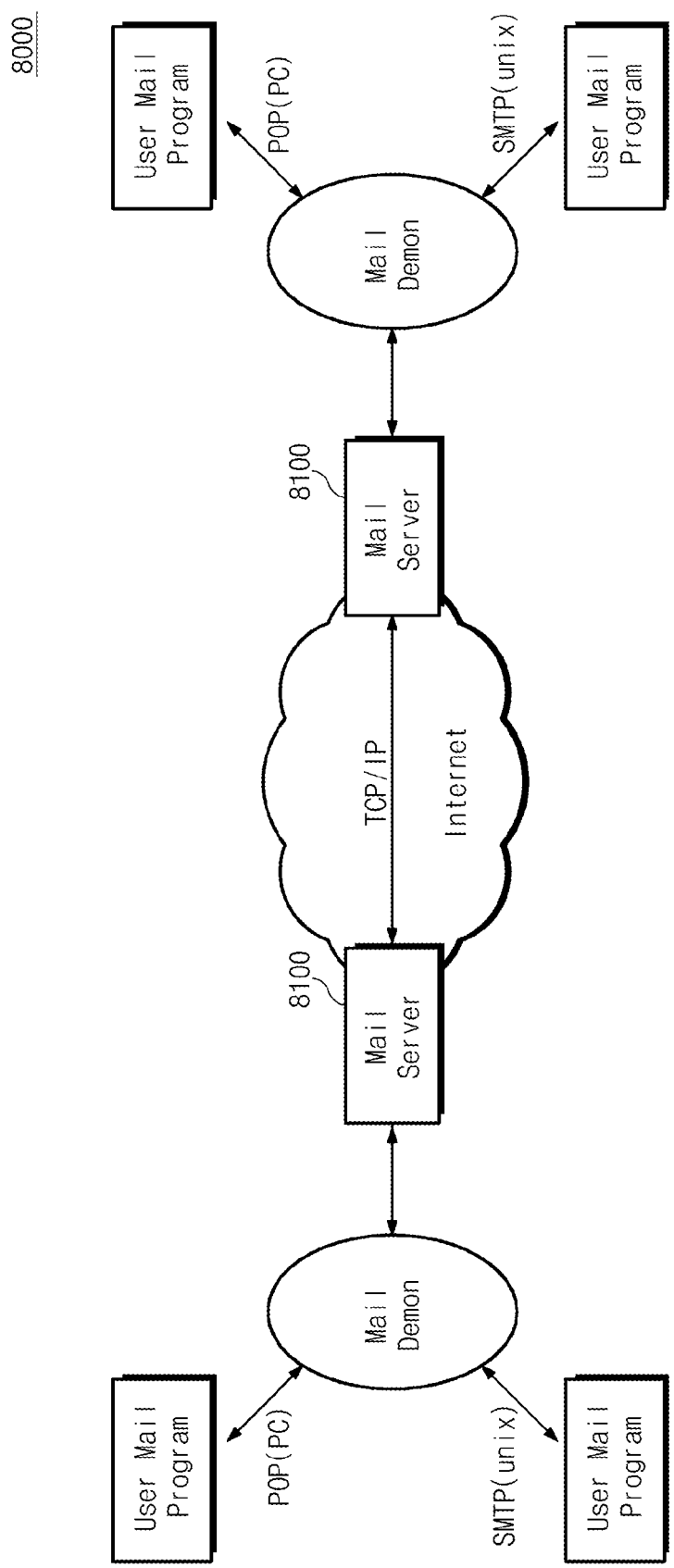

FIGS. 14 to 16 are diagrams showing systems to which a data storage device, according to embodiments of the inventive concept, may be applied.

In the event that a solid state drive including a data storage device formed of a memory controller and a multi-bit memory device, according to embodiments of the inventive concept, is applied to the storage, as illustrated in FIG. 14, a system 6000 includes storage 6100 which communicates with a host by wire or wirelessly. In a case where a solid state drive including a data storage device, according to embodiments of the inventive concept, is applied to a storage server, as illustrated in FIG. 15, a system 7000 includes storage servers 7100 and 7200 which communicate with a host by wire or wirelessly. Further, as illustrated in FIG. 16, a solid state drive including a data storage device, according to exemplary embodiments of the inventive concept, can be applied to a mail server 8100.

Figure 17:
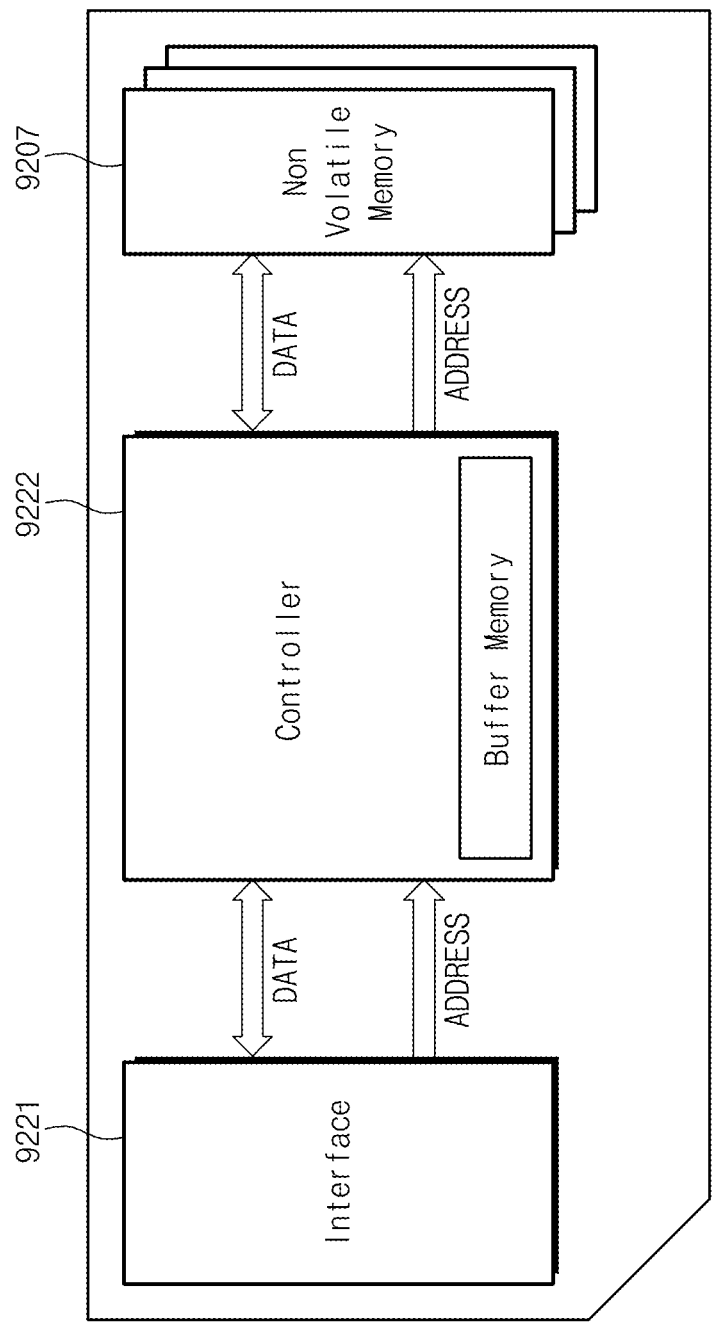
FIG. 17 is a block diagram illustrating a memory card according to an embodiment of the inventive concept.

FIG. 17 is a block diagram illustrating a memory card, according to an embodiment of the inventive concept. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 17, the memory card includes an interface circuit 9221 for interfacing with an external device, a controller 9222 including a buffer memory and controlling operations of the memory card, and at least one nonvolatile memory device 9207. The controller 9222 may be a processor, for example, configured to control write and read operations of the non-volatile memory device 9207. In particular, the controller 9222 may be coupled with each of the non-volatile memory device 9207 and the interface circuit 9221 via a data bus and an address bus. The controller 9222 and the non-volatile memory device 9207 may correspond to a controller and a nonvolatile memory device described in FIG. 1, for example. That is, the memory controller 9222 manages the life of the nonvolatile memory device 9207 according to a memory managing technique, e.g., described in relation to FIG. 4, 5, or 6, when the program-erase number of a memory block in the nonvolatile memory device 9207 reaches a reference program-erase number.

Figure 18:
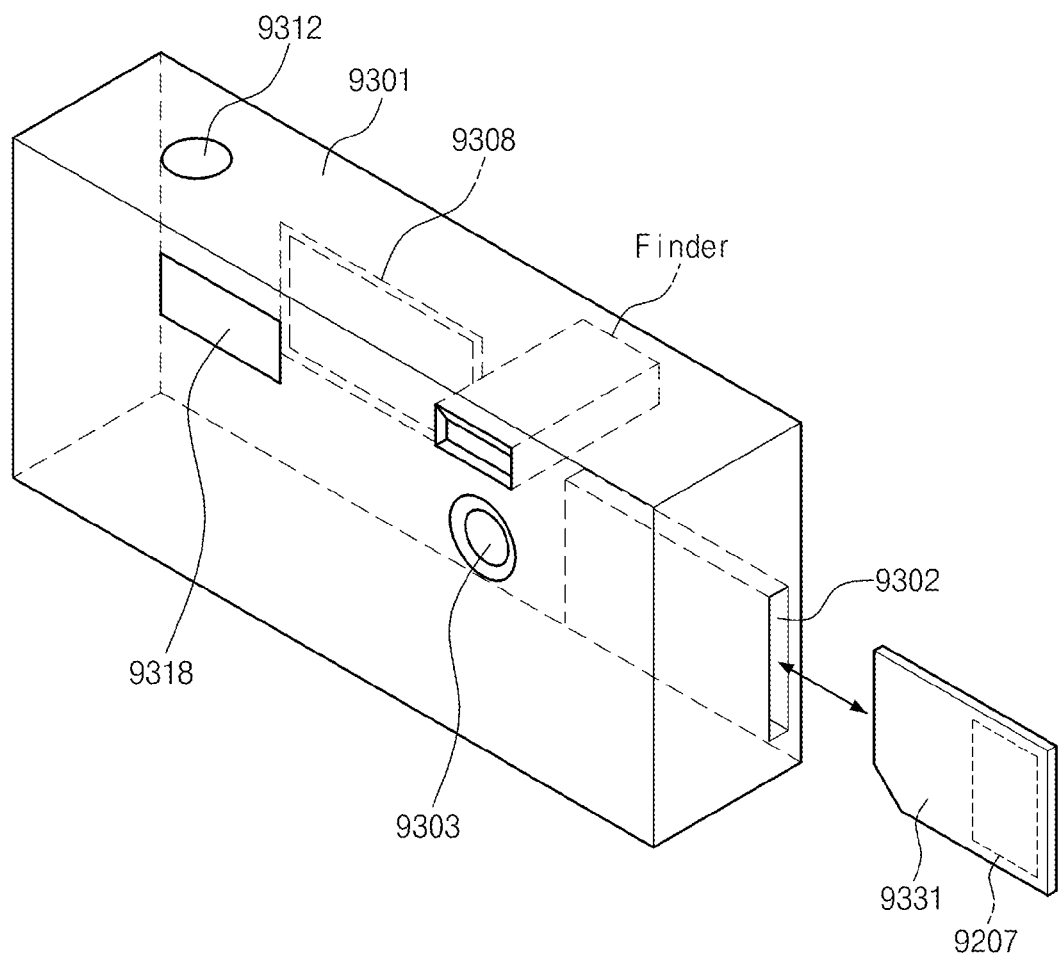
FIG. 18 is a block diagram illustrating a digital still camera, according to an embodiment of the inventive concept.

FIG. 18 is a block diagram illustrating a digital still camera, according to an embodiment of the inventive concept.

Referring to FIG. 18, a digital still camera includes a body 9301, a slot 9302, a lens 9303, a display circuit 9308, a shutter button 9312, a strobe 9318, and the like. In particular, a memory card 9331, which is insertable in the slot 9302, includes a memory controller and a nonvolatile memory device described in FIG. 1, for example. The memory controller in the memory card 9331 manages the life of the nonvolatile memory device according to a memory managing technique, e.g., described in relation to FIG. 4, 5, or 6, when the program-erase number of a memory block in the nonvolatile memory device reaches a reference program-erase number.

If the memory card 9331 has a contact type, an electric circuit on a circuit board is electrically contacted with the memory card 9331 when it is inserted in the slot 9302. In the event that the memory card 9331 has a non-contact type, an electric circuit on a circuit board may communicate with the memory card 9331 using a radio-frequency.

Figure 19:
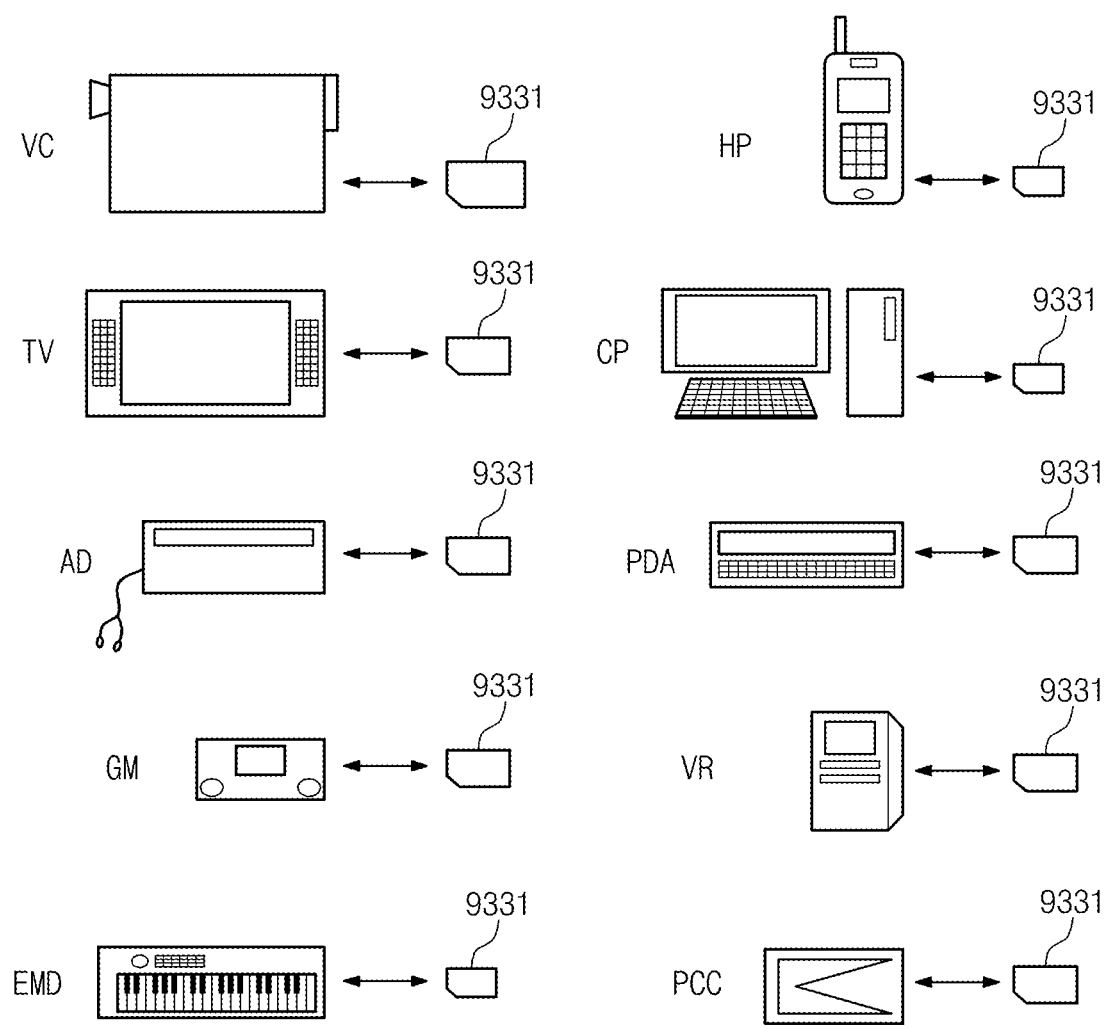
FIG. 19 are block diagrams illustrating various systems to which a memory card in FIG. 18 may be applied, according to embodiments of the inventive concept.

FIG. 19 is a diagram illustrating various systems to which the memory card in FIG. 18 may be applied.

Referring to FIG. 19, the memory card 9331 may be applied to a video camera VC, a television TV, an audio device AD, a game machine GM, an electronic music device EMD, a cellular phone HP, a computer CP, a Personal Digital Assistant PDA, a voice recorder VR, a PC card PCC, and the like.

In an embodiment of the inventive concept, memory cells can be formed of a variable resistance memory cell. An exemplary variable resistance memory cell and a memory device including the same are disclosed in U.S. Pat. No. 7,529,124 to Woo-Yeong Cho et al., which is hereby incorporated by reference.

In another embodiment of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

Examples of a memory device having a charge trap flash structure as a charge storage layer are disclosed in U.S. Pat. No. 6,858,906 to Chang-Hyun Lee et al., U.S. Patent Application Publication No. 2004/0169238 to Chang-Hyun Lee et al., and U.S. Patent Application Publication No. 2006/0180851 to Chang-Hyun Lee et al., all of which are hereby incorporated by reference. An example of a source-drain free flash structure is disclosed in KR Patent No. 673020, which is hereby incorporated by reference.

A nonvolatile memory device and/or a memory controller according to the inventive concept may be packed using various types of packages. For example, a non-volatile memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system comprising:
 a storage medium including a plurality of nonvolatile memory devices and configured to store data; and
 a memory controller including a buffer memory and configured to control the plurality of nonvolatile memory devices,
 wherein the memory controller manages a life of each of the nonvolatile memory devices based on whether a program-erase number of each memory block of each nonvolatile memory device reaches a reference value,
 wherein when the program-erase number of each memory block of a nonvolatile memory device reaches the reference value, addresses transferred to the nonvolatile memory device during a write operation where data are sequentially stored in at least two memory blocks of the nonvolatile memory device are partially discontinuous, and
 wherein when the program-erase number of each memory block of each nonvolatile memory device reaches the reference value, the memory controller controls each nonvolatile memory device such that at least two word lines located at both edges of each memory block are faded out or the memory controller controls each nonvolatile memory device such that odd or even word lines of word lines of each memory block are faded out.

2. The memory system of claim 1, wherein when the program-erase number of each memory block of the nonvolatile memory device has not reached the reference value, addresses transferred to the nonvolatile memory device during a write operation where data are sequentially stored in at least two memory blocks of the nonvolatile memory device are continuous.

3. The memory system of claim 1, wherein each nonvolatile memory device comprises an array logically divided into a first region and a second region, wherein data are stored in the first region according to a single-level cell (SLC) program method in a buffer programming operation, and data are stored in the second region according to a multi-level cell (MLC) program method in a main programming operation.

* * * * *